(12) United States Patent
Abe et al.

(10) Patent No.: US 10,299,379 B2
(45) Date of Patent: May 21, 2019

(54) SHEET-SHAPED STRETCHABLE STRUCTURE, AND RESIN COMPOSITION FOR STRETCHABLE RESIN SHEET AND STRETCHABLE RESIN SHEET USED FOR THE STRUCTURE

(71) Applicant: Panasonic Intellectual Property Management Co., Ltd., Osaka (JP)

(72) Inventors: Takatoshi Abe, Osaka (JP); Tomoaki Sawada, Osaka (JP); Shingo Yoshioka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 231 days.

(21) Appl. No.: 14/944,338

(22) Filed: Nov. 18, 2015

(65) Prior Publication Data

US 2016/0157343 A1 Jun. 2, 2016

(30) Foreign Application Priority Data

Nov. 27, 2014 (JP) ................................ 2014-239899
Apr. 3, 2015 (JP) ................................ 2015-076692

(51) Int. Cl.
*H05K 1/02* (2006.01)
*H05K 1/03* (2006.01)
(Continued)

(52) U.S. Cl.
CPC .......... *H05K 1/0393* (2013.01); *C09J 171/00* (2013.01); *H05K 1/028* (2013.01);
(Continued)

(58) Field of Classification Search
CPC ... H05K 2201/0245; H05K 2201/0272; H05K 2201/0281; H05K 2201/09036;
(Continued)

(56) References Cited

U.S. PATENT DOCUMENTS

2003/0138398 A1 7/2003 Okumura et al.
2004/0217434 A1* 11/2004 Lee .................. H01L 21/76224
257/412

(Continued)

FOREIGN PATENT DOCUMENTS

JP 2005-154675 6/2005
JP 4482633 B 6/2010
(Continued)

OTHER PUBLICATIONS

International Search Report of PCT application No. PCT/JP2015/005759 dated Apr. 5, 2016.
(Continued)

*Primary Examiner* — Michael P McFadden
(74) *Attorney, Agent, or Firm* — Greenblum & Bernstein, P.L.C.

(57) ABSTRACT

A sheet-shaped stretchable structure used as an electronics element has a stretch of not less than 10% and includes a plurality of laminated stretchable resin sheet, and at least one hollow is provided between at least one of pairs of two adjacent ones of the laminated stretchable resin sheets.

26 Claims, 7 Drawing Sheets

(51) Int. Cl.
*H05K 1/18* (2006.01)
*H05K 3/00* (2006.01)
*C09J 171/00* (2006.01)

(52) U.S. Cl.
CPC ......... *H05K 1/0283* (2013.01); *H05K 1/0373* (2013.01); *H05K 1/189* (2013.01); *H05K 3/0014* (2013.01); *H05K 2201/0108* (2013.01); *H05K 2201/0195* (2013.01); *H05K 2201/0215* (2013.01); *H05K 2201/0245* (2013.01); *H05K 2201/0272* (2013.01); *H05K 2201/0278* (2013.01); *H05K 2201/0281* (2013.01); *H05K 2201/09036* (2013.01); *H05K 2201/09045* (2013.01); *H05K 2201/10106* (2013.01); *H05K 2201/10128* (2013.01)

(58) Field of Classification Search
CPC .......... H05K 2201/09045; H05K 2201/10106; H05K 1/0393; H05K 1/028; H05K 1/0283; H05K 1/0373; H05K 1/189; H05K 3/0014; H05K 2201/0108; H05K 2201/0195; H05K 2201/0215; C09J 171/00
USPC ........................................................ 361/749
See application file for complete search history.

(56) References Cited

U.S. PATENT DOCUMENTS

| | | | |
|---|---|---|---|
| 2008/0097039 | A1 | 4/2008 | Ito et al. |
| 2008/0284310 | A1* | 11/2008 | Suehiro ............... H01L 33/56 313/498 |
| 2009/0056589 | A1* | 3/2009 | Guiheen ................. C08J 7/06 106/285 |
| 2009/0088546 | A1 | 4/2009 | Ito et al. |
| 2010/0317132 | A1 | 12/2010 | Rogers et al. |
| 2013/0100618 | A1 | 4/2013 | Rogers et al. |
| 2014/0138635 | A1 | 5/2014 | Lee et al. |
| 2014/0146383 | A1* | 5/2014 | Yasui ..................... G02F 1/167 359/296 |
| 2014/0296450 | A1 | 10/2014 | Hayashi et al. |
| 2014/0340857 | A1 | 11/2014 | Hsu et al. |
| 2015/0129808 | A1* | 5/2015 | Mrozek .................... H01B 1/22 252/503 |
| 2016/0099214 | A1* | 4/2016 | Dalal ................. H01L 23/3121 257/692 |

FOREIGN PATENT DOCUMENTS

| | | |
|---|---|---|
| JP | 2012-027488 | 2/2012 |
| JP | 2012-063437 | 3/2012 |
| JP | 2014-017495 | 1/2014 |
| WO | 2001/083566 | 11/2001 |
| WO | 2015/052853 | 4/2015 |

OTHER PUBLICATIONS

Tsuyoshi Sekitani et al: "Stretchable active-matrix organic light-emitting diode display using printable elastic conductors", Nature Materials, vol. 8, No. 6, Jun. 1, 2009 (Jun. 1, 2009), pp. 494-499, XP055136355, ISSN: 1476-1122, DOI: 10.1038/nmat2459 p. 494-p. 495.

* cited by examiner applying pressure and heat applying a voltage applying a voltage (reversed polarity)

SHEET-SHAPED STRETCHABLE STRUCTURE, AND RESIN COMPOSITION FOR STRETCHABLE RESIN SHEET AND STRETCHABLE RESIN SHEET USED FOR THE STRUCTURE

BACKGROUND

1. Technical Field

The present disclosure relates to a stretchable resin sheet and a sheet-shaped stretchable structure with a high level of tensile stress relaxation properties and excellent restoration properties after extension. The disclosure also relates to the resin composition used for the stretchable resin sheet and the sheet-shaped stretchable structure.

2. Background Art

In the field of electronics, particularly in various interfaces such as sensors, displays, and artificial skins for robots, there is an increasing need to improve wearability and shape-fitting properties. More specifically, there is a growing demand for devices that are flexible and deformable to be placed on curved or uneven surfaces. To meet this demand, stretchable electronic devices have been developed and expected as a future electronics technology.

To make an electronic device freely deformable, however, not only the electronic circuit board needs to be stretchable, but also electronic components mounted on the board need to be resistant to deformation stress. Therefore, it has been attempted to make semiconductors themselves stretchable (for example, Unexamined Japanese Patent Publication No. 2014-17495).

Meanwhile, flexible display devices such as electronic papers have been developed using flexible resin materials. Electronic papers, which come in various types such as electrophoretic and twist ball types, are generally formed of two laminated layers: a display layer to achieve a display and a conductive layer to which a voltage is applied. Electrophoretic flexible display devices usually employ urethane resin (for example, Unexamined Japanese Patent Publication No. 2012-63437), whereas twist ball display devices usually employ silicone resin (for example, Unexamined Japanese Patent Publication No. 2012-27488).

SUMMARY

The present disclosure provides a flexible, stretchable sheet-shaped structure. The sheet-shaped stretchable structure used as an electronics element according to an aspect of the present disclosure has a stretch of not less than 10% and includes a plurality of laminated stretchable resin sheets. At least one hollow is provided between at least one of pairs of two adjacent ones of the laminated stretchable resin sheets.

Providing the hollow satisfies not only mountability and sealing properties, but also extensibility, allowing the structure to be flexible and pliable. In addition, using this structure can provide flexible display devices, electronic circuits, etc. that can fit any curved surface and accommodate themselves to large deformation.

DETAILED DESCRIPTION OF PREFERRED EMBODIMENTS

First Exemplary Embodiment

Prior to describing a first exemplary embodiment of the present disclosure, problems associated with the conventional techniques will now be briefly described.

A semiconductor with a corrugated shape as in Unexamined Japanese Patent Publication No. 2014-17495 is limited in stretchability and difficult to be processed. Moreover, this technique cannot be applied to other mounted components than semiconductors. Therefore, it is required that the device architecture be designed so that unstretchable mounted components can be prevented from being subjected to stress due to stretching deformation.

The device architecture requires properties such as the ease of workability and installation according to different scenes. For example, thermoplastic resin films of polyethylene terephthalate (PET), polyimide, and polyethylene naphthalate (PEN) can be bent but cannot be stretched. Therefore, they are not adaptable to movable or stretchy parts such as the flexible joints of the body. The device architecture further requires stretchability and pliability because otherwise circuits and elements disposed inside or outside the device would be broken when a curved surface like a sphere is formed by molding under high heat and pressure.

In Unexamined Japanese Patent Publication No. 2014-17495, the wrinkling process allows stretching in a single-axial direction, but not in multi-axial directions. Moreover, the stretchable region depends on the shape of the wrinkles, and can be broken when stretched beyond the maximum length of the stretchable region.

Therefore, elements manufactured by the wrinkling process are easily exfoliated or broken due to unexpected deformation. For this reason, current flexible display devices are not more than slightly bendable.

Structures in electronics have so far been widely studied to improve their flexibility, but it has rarely been reported to successfully make the structures stretchable. The reason for this seems to be as follows. Not only the material for the structures, but also the substrate on which elements and components are to be mounted are lack of stretchability, and substrates made of stretchable material cannot easily mount elements and components thereon.

Hereinafter, the first exemplary embodiment of the present disclosure will now be described, but the present disclosure is not limited to this embodiment.

Figure 1:
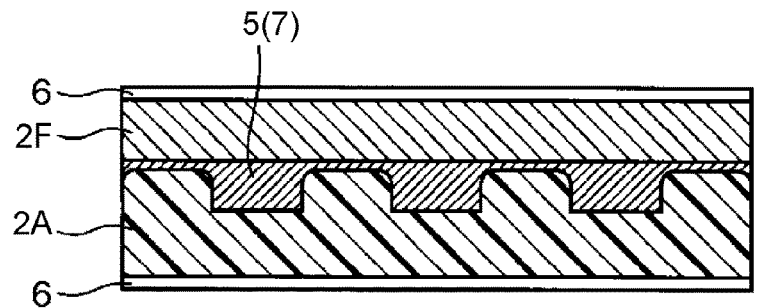
FIG. 1 is a sectional view of a sheet-shaped stretchable structure (electronic paper) according to a first exemplary embodiment of the present disclosure.

First, a sheet-shaped stretchable structure according to the first exemplary embodiment of the present disclosure will be described. FIG. 1 is a sectional view of the sheet-shaped stretchable structure (hereinafter, the structure) of the present exemplary embodiment. The structure includes a plurality of laminated stretchable resin sheets (hereinafter, sheets) 2A and 2F, and hollows 7 are provided between sheets 2A and 2F. In short, the structure is made of only stretchable materials and has hollows 7 therein. This configuration allows the structure to have a stretch of not less than 10%. As a result, the structure has excellent stretchability and mountability and also can seal a liquid and elements inside it. In the example shown in FIG. 1, hollows 7 are filled with electrophoretic liquid 5, such as pigment, and sealed. This structure is used as an electronics element. In the following description, sheets 2A and 2F, the materials used to form these sheets, and other sheets 2B to 2E described later may be collectively referred to as sheets 2.

In the present exemplary embodiment, the term "excellent stretchability" means to be elastically deformable, extensible, plastically undeformable, and to have few residual strains after deformation. More specifically, it means to have an extension of not less than 10% and almost no plastic deformation.

Figure 2:
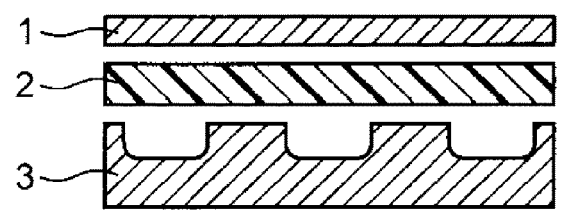
FIG. 2 is a schematic view of the procedure for manufacturing a stretchable resin sheet used in the sheet-shaped stretchable structure shown in FIG. 1.
Figure 2:
Figure 2:
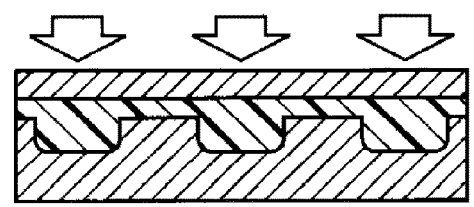
Figure 2:
Figure 2:
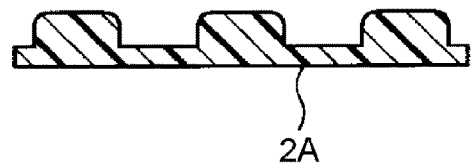

The shape and production method of hollows 7 are not limited; for example, hollows 7 can be formed as shown in FIG. 2. FIG. 2 is a schematic view of the procedure of manufacturing sheet 2A, which has an uneven surface. This shape can be preferably formed by embossing the surface of stretchable resin sheet (hereinafter, sheet) 2 so as to form a raised or recessed pattern.

Embossing the surface to form a raised or recessed pattern allows hollows 7 to be formed by a smaller number of processes. In FIG. 2, sheet 2 is disposed between mold 3 with raised portions arranged at certain intervals and flat metal plate 1, and then embossed under heat and pressure by pressing flat metal plate 1 from above. Sheet 2A may alternatively be formed by coating uncured resin on mold 3 and curing it or by coating moldable resin on mold 3 and drying it.

Sheet 2A obtained in this manner is bonded to sheet 2F so as to form separate hollows 7. Sheets 2A and 2F bonded together are then sandwiched between transparent electrodes 6. The obtained structure can be used as an electronic paper.

Alternatively, hollows 7 can be formed by using an unillustrated mold with a recessed pattern. Still alternatively, it is possible to emboss a flat film by laser drilling. Besides these methods, conventional and improved methods can be used.

The structure of the present exemplary embodiment preferably has a stretch of 10% to 500%, and more preferably 30% to 300%. A structure with a high extension of not less than 10% has high shape-fitting properties and is not easily broken, allowing hollows 7 to be kept as spaces while being extended. In contrast, a structure with a stretch of less than 10% is unpreferable because it can easily be broken when deformed. A structure composed of both a material with a stretch of not less than 10% and a material with a stretch of less than 10% is also unpreferable because the material with the extension of less than 10% can be broken and induce the breakage of the structure.

The structure does not need to have an upper limit of extension; however, in order to approximately maintain the height and volume of hollows 7, it is preferable that the stretch is not more than 500%.

As long as satisfying the above-described properties, the structure of the present exemplary embodiment may contain any material, but preferably contains a resin sheet with a stretch of not less than 10%.

Preferable examples of the resin composition for stretchable resin sheet that can be used in the present exemplary embodiment include the following: silicone resin, urethane resin, various rubbers, and thermosetting resin. Among them, thermosetting resin is preferable because sheets 2A and 2F, when made of thermosetting resin, can be excellent in heat resistance and adhesion between them. The thermosetting resin can be combined with filler to provide features such as low-thermal expansion, elasticity control, thermal conductivity, light reflectivity, and electrical conductivity.

Examples of the thermosetting resin include the following: epoxy resin, phenol resin, polyimide resin, urea resin, melamine resin, and unsaturated polyester. Among them, epoxy resin is preferable.

Examples of the epoxy resin include the following: bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxy compound of a condensation product of a phenol and an aromatic aldehyde with a phenolic hydroxyl group, triglycidyl isocyanurate, and alicyclic epoxy resin. They may be used alone or in combination of two or more thereof depending on the situation.

The epoxy resin more preferably has two or more epoxy groups and three methyl groups per molecule and has a molecular weight of not less than 500. The epoxy resin can be any commercially available one such as follows: jER1003 (available from Mitsubishi Chemical Corporation, which is bifunctional and has 7 to 8 methyl groups and a molecular weight of 1300); EXA-4816 (available from DIC corporation, which is bifunctional and has a molecular weight of 824 and many methyl groups); and YP50 (available from Nippon Steel & Sumikin Chemical Co., Ltd., which is bifunctional and has molecular weight of 60000 to 80000 and many methyl groups).

The above-enumerated epoxy resins may be used alone or in combination of two or more thereof.

It is preferable that at least one of sheets 2A and 2F be transparent. This ensures a large field of view, thereby not only facilitating the localization of the mounted components, but also providing the display function.

Some applications allow at least one of sheets 2A and 2F to be opaque. In the present exemplary embodiment, an opaque sheet is obtained by adding filler such as particles to the resin composition for stretchable resin sheet. The term "filler" here means one which is used to improve electrical and thermal conductivity or to reduce thermal expansion. When used for display applications, the filler can be particles used to improve reflectance and hence visibility, thereby improving a contrast.

Using filler allows controlling not only the resin strength and the thermal expansion coefficient, but also water-absorbing properties and electroconductivity.

The filler can be of various types depending on the application. It is preferable that the filler includes at least one selected from organic fibers, carbon fibers, glass fibers, and metal fibers. Using such filler reinforces the resin strength, allowing the stretchable resin sheet to be pliable and tough.

Using such filler also facilitates the control of the linear thermal expansion, making the stretchable resin sheet easier to deal with, more electrically conductive and less expensive. If needed, these fibers can be surface-treated with a coupling agent or surface-modified by graft polymerization by any of conventional and improved methods. The fiber fabrics can be of any type such as woven and nonwoven.

Examples of the organic fibers include the fibers based on the following material: polyethylene, poly(p-phenylenebenzobisoxazole), aramid, polyester, vinylon, polypropylene, nylon, rayon, polylactic acid, polyarylate, polyphenylene sulfide, polyimide, and fluorine resin.

Examples of the metal fibers include fiber fabrics of steel and silver, and random mesh.

Other examples of the filler can be selected from spherical, crushed, flaky, and discontinuous fiber-like particles. The components of the filler are not particularly limited and may, for example, contain at least one substance including an element selected from Si, Cu, Ag, Au, Al, Mg, Pt, and Ti. Using such filler reduces the cost and improves the linear expansion, electrical conductivity, flame retardance, and optical properties such as refractive index. The size and particle diameter of the filler are not particularly limited; however, when the particle diameter is in the range from 1 nm to 100 nm, the filler can be used in comparatively small amounts to effectively improve the optical properties, electrical conductivity, and linear expansion. Meanwhile, fillers with a particle diameter in the range from 100 nm to 50 micrometers are cost advantageous as material and easy to deal with and cost advantageous for manufacture.

Specific examples of the substance including the element selected from Si, Cu, Ag, Au, Al, Mg, Pt, and Ti include the following particles, flakes, and wires: silica, copper particles, copper-plated particles, silver particles, silver flakes, silver wires, silver-plated particles, gold particles, gold wires, gold-plated particles, aluminum particles, aluminum oxide particles, aluminum hydroxide particles, magnesium particles, magnesium hydroxide, magnesium oxide, platinum particles, platinum-plated particles, titanium particles, titanium oxide particles, and titanium oxide-coated particles. They may be used alone or in combination of two or more thereof. These particles, flakes, and wires may be used according to any of conventional and improved methods. More specifically, filler can be added to a varnish made by dissolving resin in a solvent and dispersed using a dispersing machine such as a bead mill, a jet mill, a planetary stirrer, a homodisper, or an ultrasonic wave disperser.

Still other examples of the filler include carbon nanotubes and/or metal wires. Using such filler is preferable to efficiently provide the resin composition with electrical conductivity. More specifically, the same level of electrical conductivity can be provided by adding smaller amounts of filler than spherical and flaky conductive materials. Thus, such filler is preferable because of its high cost-effectiveness as well as its easiness to maintain resin properties, allowing the resin composition to maintain its electrical conductivity when stretched, bent, or deformed in other ways.

These conductive materials can be dispersed in resin by any of conventional and improved methods. More specifically, dispersion liquid is prepared by adding filler and a dispersant such as a cellulosic or amine- or sulfuric acid-based ionic liquid to a solvent such as water, methyl isobutyl ketone, methyl ethyl ketone, toluene, acetone, or dimethylformamide. Next, resin is added to the dispersion liquid, and the solvent is removed to disperse the filler into the resin.

The carbon nanotube is not particularly limited in type, but can be, for example, a single-wall carbon nanotube, a double-wall carbon nanotube, or a multiwall carbon nanotube. These carbon nanotubes can by synthesized by any of conventional and improved methods. Different types of carbon nanotubes are used for different purposes; for example, in order to give priority to electrical conductivity, it is preferable to use a carbon nanotube with high crystallinity, that is, a G/D ratio of 10 or more when determined by Raman spectroscopy.

Examples of the metal wire include discontinuous metal fibers with high aspect ratio, such as silver nanowires, silver nanorods, and gold nanorods.

The sizes of these carbon nanotubes and metal wires are not particularly limited; however, when the diameter is not less than 1 nm and not more than 100 nm and the length is not less than 1 micrometer and not more than 10 mm, the filler can be well dispersed in the resin so as to improve electrical conductivity and reinforcement.

The above-enumerated fillers may be used alone or in combination of two or more thereof.

In the case that the resin composition contains filler, the filler content can be properly adjusted according to the use of the stretchable resin sheet; it is preferably not less than 0.05 wt % and not more than 80 wt %, in general. In this range, the resin properties can be maintained, and appropriate functions can be provided.

A filler content of less than 0.05 wt % is not preferable because it may not allow taking advantage of filler properties such as low-thermal expansion, thermal conductivity, and electrical conductivity. A filler content of more than 80 wt % is not preferable because it may not allow taking advantage of resin properties such as stretchability, pliability, and extensibility.

The filler content of not less than 0.05 wt % and not more than 50 wt % is considered to be more preferable because it provides high stress relaxation properties and few residual strains.

In the present exemplary embodiment, all of sheets 2 can be made of either the same or different types of materials (resins).

In a preferred exemplary embodiment, one of sheets 2 can be used as the basemember, and the other can be used as a sealing member, and after-mentioned various members and/or materials can be sealed in hollows 7 formed between the base member and the sealing member. This enables the stretchable structure of the present exemplary embodiment to be used as an electronics element for many purposes.

In the present exemplary embodiment, hollows 7 means separate spaces formed between at least one of pairs of two adjacent ones of two or more laminated sheets 2 inside the stretchable structure.

In the case of using three or more laminated sheets 2, hollows 7 do not necessarily have to be formed between each adjacent pair; hollows 7 have only to be formed between at least one pair. For example, hollow 7 has only to be formed at least between the base member and the sealing member, and either a base member or a sealing member may be composed of two or more laminated sheets 2.

In the stretchable structure of the present exemplary embodiment, hollows 7 may have any shape and space occupancy as long as the structure satisfies the above condition. For example, for the purpose of sealing electronic components, the space occupancy of hollow(s) 7 is 1% to 50% of the stretchable structure. For the purpose of sealing a liquid used for the display, the space occupancy is preferably not less than 50%.

In a structure including two laminated sheets 2, hollow 7 can be formed by providing an adhesive layer between the surface of the base member formed of one sheet 2 and the surface of the sealing member formed of the other sheet 2 facing the base member surface. The adhesive layer may be formed on the surface of either the base member or the sealing member. Providing the adhesive layer facilitates bonding the base member and the sealing member.

The adhesive layer may have any thickness and may be made of any material, such as curing resin or adhesive resin. Examples of the curing resin that can be used for the adhesive layer include the following: acrylic resin, epoxy resin, urethane resin, and silicone resin. Examples of the adhesive resin include terpene-based resin and unsaturated aliphatic resin in addition to the above-mentioned resins.

Figure 3:
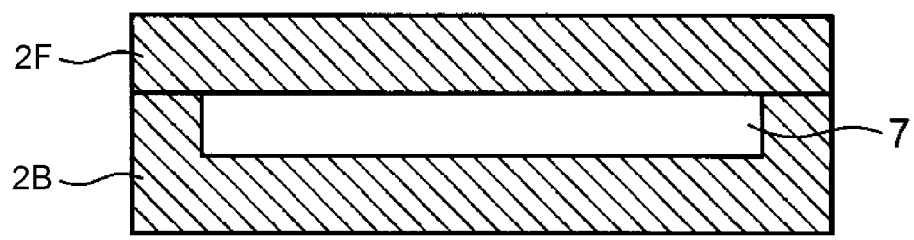
FIG. 3 is a sectional view of another sheet-shaped stretchable structure according to the first exemplary embodiment of the present disclosure.
Figure 4:
FIG. 4 is a sectional view of a stretchable resin sheet used in the sheet-shaped stretchable structure shown in FIG. 3.
Figure 5:
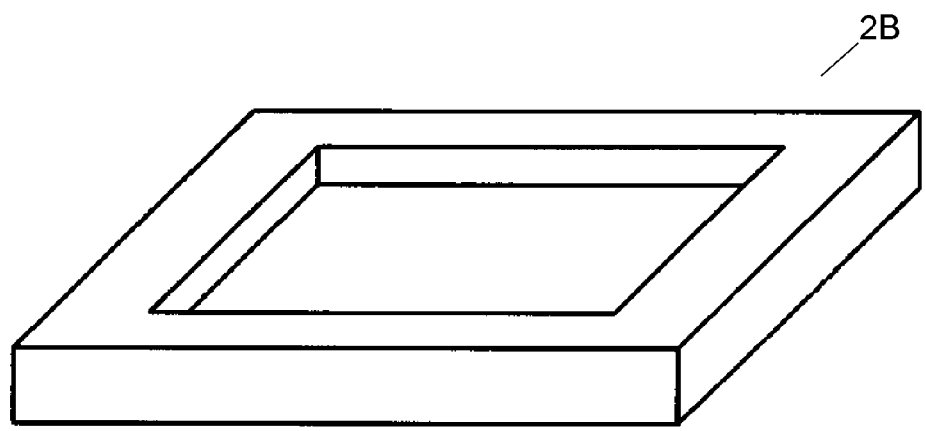
FIG. 5 is a perspective view of the stretchable resin sheet shown in FIG. 4.

Modified examples of hollows 7 will now be described with reference to FIGS. 3 to 5. FIG. 3 is a sectional view of another sheet-shaped stretchable structure of the present exemplary embodiment. FIG. 4 is a sectional view of stretchable resin sheet (hereinafter, sheet) 2B used in the sheet-shaped stretchable structure shown in FIG. 3. FIG. 5 is a perspective view of sheet 2B. The structure shown in FIG. 3 has hollow 7 formed by combining sheet 2B with a recessed pattern and flat sheet 2F.

A procedure of sealing LED 10 as an electronic component into hollow 7 of a structure similar to the structure shown in FIG. 3 will now be described with reference to FIG. 6.

First, in the same manner as in FIG. 3, sheet 2E with a recessed pattern and flat sheet 2F are prepared. Meanwhile, stretchable conductive paste is prepared and formed into wires 9A and lands 9B on the surface of sheet 2E. Lands 9B function as connections between the printed wires and the LED. The stretchable conductive paste is prepared by, for example, adding 90 wt % of silver particles with a diameter of 2.1 micrometers to urethane resin (HUX-561 available from Adeka Corporation). Next, LED 10 as an electronic component is installed in hollow 7 and is connected to lands 9B using an electrically conductive adhesive.

Next, sheets 2F and 2E are bonded together and LED 10 is sealed within hollow 7 by, for example, heating at 170 degrees Celsius for one hour. Finally, for being connecting LED 10 to an external power supply, after the sheets are laser-drilled, vias 12 and wires 9A are printed using the above-described stretchable conductive paste and then connected to the power supply.

Figure 7:
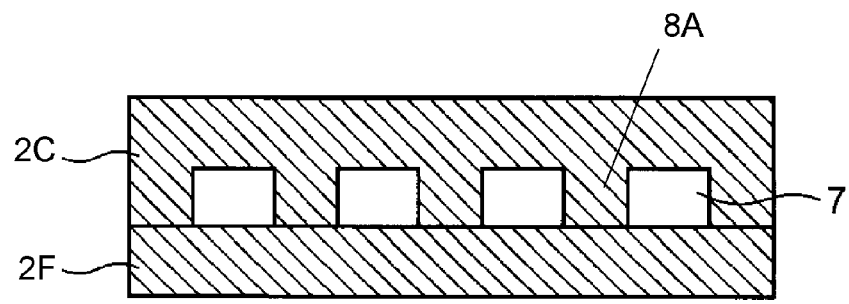
FIG. 7 is a sectional view of further another sheet-shaped stretchable structure according to the first exemplary embodiment of the present disclosure.
Figure 8:
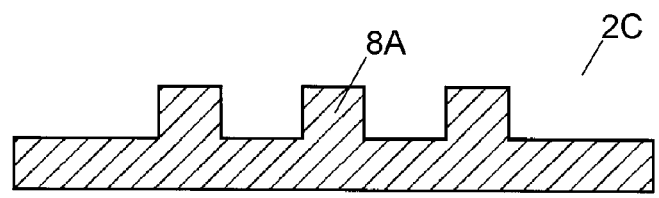
FIG. 8 is a sectional view of a stretchable resin sheet used in the sheet-shaped stretchable structure shown in FIG. 7.
Figure 9:
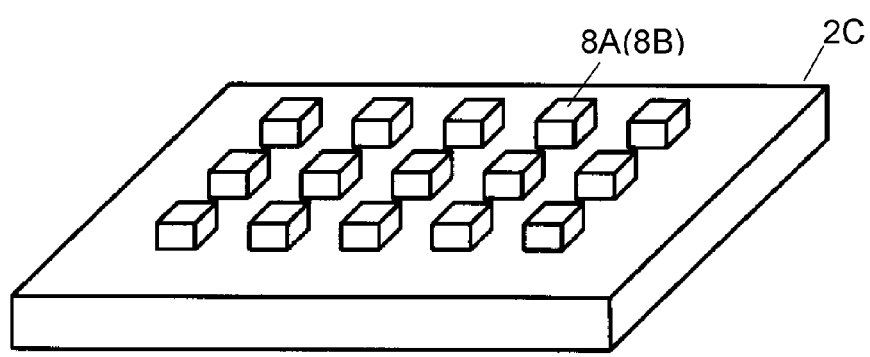
FIG. 9 is a perspective view of the stretchable resin sheet shown in FIG. 8.

As another modified example, as shown in FIG. 7, hollow 7 can be formed by combining stretchable resin sheet (hereinafter, sheet) 2C with a raised pattern with flat sheet 2F. FIG. 7 is a sectional view of further another sheet-shaped stretchable structure of the present exemplary embodiment. FIGS. 8 and 9 are a sectional view and a perspective view, respectively, of sheet 2C with projections 8A. Projections 8A function as support members to keep the height of hollow 7. This structure allows maintaining hollow 7 stably.

Projections 8A can be formed, for example, by regularly or irregularly embossing at least one of the base member and sealing member which are sheets 2 (2F).

Figure 10:
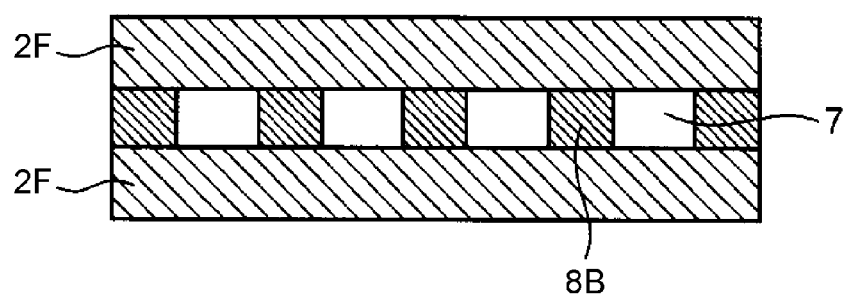
FIG. 10 is a sectional view of a stretchable structure with hollows according to the first exemplary embodiment of the present disclosure, which is composed of a flat stretchable resin sheet and support members (formed by photolithography).

As shown in FIG. 10, it is possible to replace sheet 2C by flat sheet 2F, to provide columnar bodies 8B on the surface of flat sheet 2F, and to combine sheet 2C with another sheet 2F. FIG. 10 is a sectional view of a stretchable structure of to the present exemplary embodiment formed by combining flat sheets 2F and columnar bodies 8B as the support members. Columnar bodies 8B can be formed on sheet 2F, for example, by photolithography.

Figure 11:
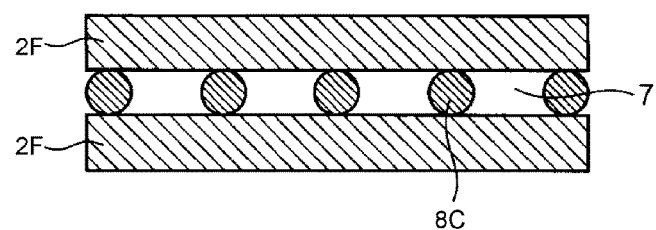
FIG. 11 is a sectional view of further another sheet-shaped stretchable structure according to the first exemplary embodiment of the present disclosure.
Figure 12:
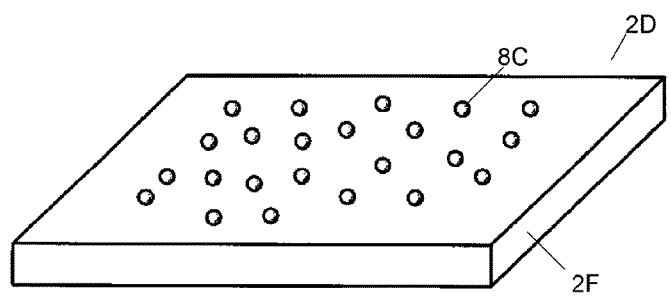
FIG. 12 is a perspective view of a stretchable resin sheet used in the sheet-shaped stretchable structure shown in FIG. 11.

As shown in FIGS. 11 and 12, columnar bodies 8B may be replaced by beads 8C, which are formed on flat sheet 2F. FIG. 11 is a sectional view of further another sheet-shaped stretchable structure of the present exemplary embodiment. FIG. 12 is a perspective view of stretchable resin sheet (hereinafter, sheet) 2D used in the sheet-shaped stretchable structure shown in FIG. 11. Beads 8C function in the same manner as columnar bodies 8B. Hollow 7 can be formed by disposing sheet 2D in such a manner that beads 8C, which function as spacers, are disposed between the base member and the sealing member. Although not illustrated, columnar bodies 8B and beads 8C can be replaced by a mesh-sheet spacer.

Projections 8A, columnar bodies 8B, and beads 8C are not limited in shape, height and the area ratio in plane. For example, in the case of sealing a liquid crystal within hollow 7, a height of not more than 10 micrometers is preferable for visibility and cost reasons. Meanwhile, in the case of sealing film-like electronic components or elements within hollow 7, it is preferable to determine the height of hollows 7 according to the height of the electronic components or elements so as to give first priority to their protection.

The method of manufacturing the stretchable resin sheet of the present exemplary embodiment is not particularly limited. For example, in the case of using one of the above-enumerated epoxy resins as well as silicone resin or urethane resin, a resin-containing solution such as an emulsion, or a resin composition is first prepared using a curing agent or a solvent if necessary.

The resin composition thus prepared is coated to have a desired thickness on a release-treated film using a bar coater or a spin coater. Next, the solvent is removed by heat-drying and the resultant is cured with heat or light, thereby forming a stretchable resin sheet.

The resin composition may be heat-dried and cured using any of the conventional and improved methods, devices, and conditions.

The specific temperature and time of the heating can be properly adjusted according to the used cross-linking agent, solvent, and the like. For example, the resin composition can be obtained by drying or curing for 30 to 180 minutes at 130 to 200 degrees Celsius, which is not lower than either the boiling point of the solvent or the glass transition point.

Alternatively, the resin composition can be semi-cured by adjusting the temperature and time of drying or curing. Semi-cured sheet 2 can be disposed between two adjacent sheets 2 so as to function as an adhesive to bond them. An additional curing process can be performed to completely integrate these sheets. Semi-cured sheet 2 can alternatively be used outside the adjacent sheets in order to bond the sealing member and the base member together.

Sheets 2 can also be bonded together using an adhesive as described above. The adhesive can be any type, such as acrylic resin, epoxy resin, urethane resin, silicone resin, terpene-based resin, and unsaturated aliphatic resin. These adhesives can be coated on a release-treated sheet using a bar coater or a spin coater, and then transferred to sheet 2 to be bonded, thereby forming an adhesive layer. Another method of bonding sheets 2 together is to bond the adhesive layer directly to the stretchable resin sheet by the above-described method. In the present exemplary embodiment, not only this conventional method but also other improved methods can be used.

Two or more laminated sheets 2 are bonded together by the above-described method or other methods, thereby forming hollow 7, and hence, the stretchable structure. If necessary, it is also possible to provide an insertion opening such that hollow 7 is communicated with the outside of the stretchable structure.

An insertion opening is preferable, for example, to introduce a liquid or elements into hollow 7. After hollows 7 are formed by bonding laminated sheets 2 together, a desired liquid can be introduced into arbitrary hollow 7 through the insertion opening by a dispenser or by a method such as vacuum differential pressure casting, immersion, direct compressing, and centrifugal compressing.

In the case of the absence of an insertion opening, a liquid is applied to either flat sheet 2F or embossed sheet 2B or 2C. In order to seal an electronic component, sheet 2E on which the electronic component is previously mounted is bonded to another sheet 2 as described with reference to FIG. 6. Sealing an electronic component within hollow 7 can increase the range of packaging options and the size of the electronic component, thereby greatly reducing design constraints. The liquid and the electronic component can be introduced and sealed into hollow 7 by any of the conventional and improved methods.

As described with reference to FIG. 6, in order to form a circuit or electrodes, it is preferable to provide a conductive layer at one of the following positions: between any adjacent ones of sheets 2; on the top surface of the uppermost one of sheets 2, and on the bottom surface of the lowermost one of sheets 2 used in the structure of the present exemplary embodiment. The conductive layer allows the connection between hollows 7 and a device. The conductive layer is preferably resistant to stretching, and can be formed by any of the conventional and improved methods.

More specifically, the conductive layer can be formed by applying printing, coating, or etching technique to the following materials: copper foil in the shape of a horseshoe, a rectangle, a zigzag pattern, or a waveform; silver paste; silver nanowire; carbon nanotube; or conductive polymer. Any other material resistant to stretching can be used alone or in combination to form the conductive layer.

The above-mentioned conductive layer can alternatively be formed by coating or deposition, and then, insulation space can be drawn by a laser so as to form a circuit. It is also possible to a circuit pattern by exposure and development after forming a resist layer on sheet 2 by photolithography or lifting up. It is also possible to directly form a circuit pattern on sheet 2 using a laser by a semi-additive process, followed by applying electroless plating. It is also possible to employ a printing method using a gravure plating plate or a screen plating plate, or a conductive ink-jet printing. The circuit pattern can increase the design freedom of electronic devices, such as wearable terminals.

Further, as the circuit structure, it is possible to form a through-hole passing through sheet 2 and connecting the electronic component in hollow 7 with a device. A via hole for connecting both sides of sheet 2 as a circuit wiring may be formed. A hole for mounting a connector may be formed. It is also possible to form a land or pad for mounting and soldering an electronic component, or a wire connecting the land and the pad. The conductive layer can be formed on one or both sides of sheet 2. In the case that two or more of the same type of sheets 2 are bonded together, three or more conductive layers can be formed.

The stretchable structure of the present exemplary embodiment can be used as an electronics element for various applications. For example, in the case that a conductive layer is provided and that a liquid or pigment required for display such as a cholesteric liquid crystal or an electrophoretic solution is introduced within hollow 7, the structure can be used as a stretchable electronic paper. In addition, constraints on the installation location of the display can be greatly reduced.

Cholesteric liquid crystals are display materials that are liquid at or around room temperature and become visible when the orientation in the molecular structure is changed by a potential difference. Electrophoretic solutions are used as display materials and contain positively and negatively charged pigment particles of different colors dispersed therein.

Electrophoretic solutions can be prepared by adding positively charged black particles, negatively charged white particles, a dispersant, and a charge control agent, to a high-boiling-point solvent, and dispersing them ultrasonically. Using such an electrophoretic solution allows the pigment particles to be drawn to opposite electrodes by the potential difference, thereby achieving a mechanism for producing visibility. Other materials and mechanisms designed for display can be used by any of the conventional and improved methods.

As another aspect of the present embodiment, an electronic component or an element may be installed in hollow 7 of the stretchable structure. The position and the method of installation of the electronic component or the element is not particularly limited; it is possible to use an adhesive, a double-sided adhesive tape, paste, solder, etc. that are electrically conductive. It is also possible to seal the electronic component, the element or the wiring part together with a shielding material so as to improve moisture- and oxygen-shielding properties. Although the material used for sealing can be either stretchable or not, the proportion of the volume of the sealed electronic component or the element (the target object) with respect to the total volume of hollow(s) 7 in the entire structure is preferably not more than 50%, and more preferably not more than 20%. In this range, the stretchability of the structure can be preferably maintained.

Effects of the present exemplary embodiment will now be described in specific examples, but the present disclosure is not limited to these examples.

EXAMPLES (Example 1) Production (I) of a Sheet-Shaped Stretchable Structure with Hollows 7

Example 1-1

First, the following materials are uniformly mixed: 75 parts by weight of epoxy resin (jER1003 available from Mitsubishi Chemical Corporation); 100 parts by weight of polyrotaxane (SH3400P available from Advanced Softmaterials Inc.); 45 parts by weight of cross-linking agent (isocyanate, DN-950 available from DIC corporation); and 1.1 parts by weight of imidazole-based curing accelerator (2-ethyl-4-methylimidazole, 2E4MZ available from Shikoku Chemicals Corporation). The obtained mixture is heated at 100 degrees Celsius for 10 minutes, thereby forming two stretchable resin sheets 2 each with a thickness of 50 micrometers. One of sheets 2 is formed into stretchable resin sheet 2B with a recessed pattern by molding it in a mold with a raised pattern, and the other is directly used as flat stretchable resin sheet 2F. Next, sheets 2B and 2F are bonded together and heated at 170 degrees Celsius for one hour, thereby forming a sheet-shaped stretchable structure with hollows 7 (extension: 130%) (see FIGS. 3 to 5).

Example 1-2

First, the following materials are uniformly mixed: 100 parts by weight of silicone elastomer (Silpot 184 available from Dow Corning Toray Co., Ltd.); and 10 parts by weight of silicone resin catalyst (silpot184 CAT available from Dow Corning Toray Co., Ltd.). The obtained resin mixture is heated at 100 degrees Celsius for 5 minutes, thereby forming one stretchable resin sheet 2 (2F) with a thickness of 50 micrometers. In addition, the same resin mixture is coated on the same mold with a raised pattern as used in Example 1-1, heated at 100 degrees Celsius for one hour, and removed from the mold, thereby forming sheet 2B with a recessed pattern. Next, sheets 2B and 2F are bonded together and heated at 100 degrees Celsius for one hour, thereby forming a sheet-shaped stretchable structure with hollows 7 (extension: 160%).

Example 1-3

First, sheet 2B with a recessed pattern is formed as follows: 100 parts by weight of urethane resin (HUX-561 available from Adeka Corporation) is coated on a mold with a raised pattern in the same manner as in Example 1-2, heated at 100 degrees Celsius for one hour, and removed from the mold. Next, HUX-561 is coated on a PET film (support body), laminated on top of sheet 2B in such a manner that the side with the raised pattern of sheet 2B faces the coated resin, and heated at 100 degrees Celsius for one hour, thereby forming a sheet-shaped stretchable structure with hollows 7 (extension: 400%).

Example 1-4

First, the following materials are uniformly mixed: 100 parts by weight of an ethylene oxide adduct of hydroxyphenyl fluorene epoxy resin (EG-280 available from Osaka Gas Chemicals Co., Ltd.); 45 parts by weight of cross-linking agent (isocyanate, DN-950 available from DIC corporation); 1.1 parts by weight of imidazole-based curing accelerator (2E4MZ available from Shikoku Chemicals Corporation); and 50 parts by weight of acid anhydride curing agent (YH306 available from Mitsubishi Chemical Corporation). Subsequently, the same procedure as in Example 1-1 is performed, thereby forming a sheet-shaped stretchable structure (extension: 400%).

(Example 2) Production (II) of a Sheet-Shaped Stretchable Structure with Hollows 7

Example 2-1

The same two sheets 2 as used in Example 1-1 are prepared. One is formed into embossed stretchable resin sheet 2C with a raised embossed pattern by molding it in a mold with embossed cubes each having sides of 30 micrometers (see FIGS. 8 and 9), and the other is directly used as flat sheet 2F. Next, sheets 2C and 2F are bonded together and heated at 170 degrees Celsius for one hour, thereby forming a sheet-shaped stretchable structure with hollow 7 (extension; 120%).

Example 2-2

First, the same components as used in Example 1-2 are uniformly mixed and heated at 100 degrees Celsius for 5 minutes, thereby forming one sheet 2F with a thickness of 50 micrometers. The resin mixture is also coated on the same embossed mold as used in Example 2-1, heated at 100 degrees Celsius for one hour, and removed from the mold, thereby forming sheet 2C with a raised embossed pattern. Next, sheets 2C and 2F are bonded together and heated at 100 degrees Celsius for one hour, thereby forming a sheet-shaped stretchable structure with hollow 7 (extension: 160%).

Example 2-3

First, the same components as used in Example 1-3 are uniformly mixed, coated on the same embossed mold same as in Example 2-2, heated at 100 degrees Celsius for one hour, and removed from the mold, thereby forming sheet 2C with a raised embossed pattern. Next, HUX-561 is coated on a PET film (support body), laminated on top of sheet 2C in such a manner that the embossed side of sheet 2C faces the coated resin, and heated at 100 degrees Celsius for one hour, thereby forming a sheet-shaped stretchable structure with hollow 7 (extension: 400%).

Example 2-4

First, the same components as used in Example 1-4 are uniformly mixed. Subsequently, the same procedure as in Example 2-1 is performed, thereby forming a sheet-shaped stretchable structure (extension: 400%).

(Example 3) Production (III) of a Sheet-Shaped Stretchable Structure with Hollow 7

Example 3-1

First, the same components as used in Example 1-1 are uniformly mixed and heated at 100 degrees Celsius for 10 minutes, thereby forming two sheets 2 (2F) each with a thickness of 50 micrometers. Next, beads spacers with a diameter of 10 micrometers are sprayed and arranged at appropriate intervals on one of sheets 2 (2F) (see FIG. 12). The other sheet 2F is then laid on the first sheet 2F so that the beads spacers are sandwiched between two sheets 2F. The laminated sheets are then heated at 170 degrees Celsius for one hour, thereby forming a sheet-shaped stretchable structure with hollow 7 (extension: 150%).

Example 3-2

First, the same components as used in Example 1-2 are uniformly mixed and heated at 100 degrees Celsius for 5 minutes, thereby forming two sheets 2 (2F) each with a thickness of 50 micrometers. Next, beads spacers with a diameter of 10 micrometers are sprayed and arranged at appropriate intervals on one of sheets 2F. The other sheet 2F is then laid on the first sheet 2F so that the beads spacers are sandwiched between two sheets 2F. The laminated sheets are then heated at 100 degrees Celsius for one hour, thereby forming a sheet-shaped stretchable structure with hollow 7 (extension: 200%).

Example 3-3

First, the same components as used in Example 1-3 are coated on a PET film (support body), and glass beads spacers with a diameter of 20 micrometers are sprayed and arranged at appropriate intervals on the coated matter. The film is then heated at 100 degrees Celsius for one hour, thereby forming stretchable resin sheet 2D whose surface is embedded with some of the glass beads spacers. Next, a PET film coated with HUX-561 and used as a base member is laid on the bead-sprayed surface of sheet 2D. The resulting object is heated at 100 degrees Celsius for one hour, thereby forming a sheet-shaped stretchable structure with hollow 7 (extension: 500%).

Example 3-4

First, the same components as used in Example 1-4 are uniformly mixed. Subsequently, the same procedure as in Example 3-1 is performed, thereby forming a sheet-shaped stretchable structure (extension: 500%).

Example 3-5

First, the following materials are uniformly mixed: 100 parts by weight of epoxy resin (jER1003 available from Mitsubishi Chemical Corporation); 100 parts by weight of polyrotaxane (SH3400P available from Advanced Softmaterials Inc.); 45 parts by weight of cross-linking agent (isocyanate, DN-950 available from DIC corporation); 1.1 parts by weight of imidazole-based curing accelerator (2-ethyl-4-methylimidazole, 2E4MZ available from Shikoku Chemicals Corporation); and glass filler (CF0111-B15C available from Nippon Frit Co., Ltd.). Subsequently, the same procedure as in Example 1-1 is performed, thereby forming a sheet-shaped stretchable structure (extension: 90%).

COMPARATIVE EXAMPLES

Comparative Example 1-1

First, the following materials are uniformly mixed: 100 parts by weight of epoxy resin (jER1003 available from Mitsubishi Chemical Corporation); and 5 parts by weight of imidazole-based curing accelerator (2-ethyl-4-methylimidazole, 2E4MZ available from Shikoku Chemicals Corporation). Subsequently, the same procedure as in Example 1-1 is performed, thereby forming a sheet-shaped structure with hollows (extension: less than 5%).

Comparative Example 1-2

First, the same components as used in Comparative Example 1-1 are uniformly mixed. Subsequently, the same procedure as in Example 2-1 is performed, thereby forming a sheet-shaped structure with a hollow (extension: less than 5%).

Comparative Example 1-3

First, the same components as used in Comparative Example 1-1 are uniformly mixed. Subsequently, the same procedure as in Example 3-1 is performed, thereby forming a sheet-shaped structure with a hollow (extension: less than 5%).

Comparative Example 2-1

First, a 50 micrometers-thick polyethylene naphthalate (PEN) film (available from Teijin DuPont Films) is molded at 200 degrees Celsius for one hour using the same mold with the raised pattern as used in Example 1-1, thereby forming a sheet with a recessed pattern. Meanwhile, the same resin composition mixture as obtained and used in Example 1-1 is laid as a 10 micrometer-thick adhesive layer on the flat PEN film. Next, the above-mentioned sheet with the recessed pattern is bonded to this adhesive layer and thermally cured, thereby forming a sheet-shaped structure with hollows (extension: less than 10%).

Comparative Example 2-2

First, the same 50 micrometers-thick PEN film as used in Comparative Example 2-1 is molded at 200 degrees Celsius for one hour using the same embossed mold as used in Example 2-1, thereby forming a sheet with a raised embossed pattern. Meanwhile, the same the same resin composition mixture as obtained and used in Example 1-1 is laid as a 20 micrometer-thick adhesive layer on the flat PEN film Next, the above-mentioned embossed sheet is bonded to the adhesive layer and thermally cured, thereby forming a sheet-shaped structure with a hollow (extension: less than 10%). However, the embossed parts on the embossed sheet have heights varying in the range of 10 to 30 micrometers and are also curled.

Comparative Example 2-3

First, the same resin composition mixture as obtained and used in Example 1-1 is laid as a 10 micrometer-thick adhesive layer on the surface of the same 50 micrometers-thick PEN film as used in Comparative Example 2-1. Next, glass beads spacers with a diameter of 20 micrometers are sprayed and arranged at appropriate intervals on the adhesive layer. Another PEN film is then laid on the first PEN film so that the beads spacers are sandwiched between the two films. The laminated films are then heated at 170 degrees Celsius for one hour, thereby forming a sheet-shaped structure with a hollow.

(Evaluation; Confirmation of Stretchability)

First, the sheet-shaped structures formed in the above-described examples and comparative examples are extended by either 10% or 30% while both ends of each structure are held. Next, the extension stress is released to confirm the state of the restored structure. The results are evaluated using the following criteria.

After being extended, each structure is evaluated as follows: if restored without being partially or completely broken, the structure is evaluated as OK; if not restored although not partially or completely broken, the structure is evaluated as NG; and if partially or completely broken, the structure is evaluated as Broken NG. The results are shown in Table 1.

TABLE 1

| | 10% extension/restoration | 30% extension/restoration |
|---|---|---|
| Example 1-1 | OK | OK |
| Example 1-2 | OK | OK |
| Example 1-3 | OK | OK |
| Example 1-4 | OK | OK |
| Example 2-1 | OK | OK |
| Example 2-2 | OK | OK |
| Example 2-3 | OK | OK |
| Example 2-4 | OK | OK |
| Example 3-1 | OK | OK |
| Example 3-2 | OK | OK |

TABLE 1-continued

|  | 10% extension/restoration | 30% extension/restoration |
| --- | --- | --- |
| Example 3-3 | OK | OK |
| Example 3-4 | OK | OK |
| Example 3-5 | OK | OK |
| Comparative Example 1-1 | Broken NG | Broken NG |
| Comparative Example 1-2 | Broken NG | Broken NG |
| Comparative Example 1-3 | Broken NG | Broken NG |
| Comparative Example 2-1 | NG | NG |
| Comparative Example 2-2 | NG | NG |
| Comparative Example 2-3 | NG | NG |

As apparent from Table 1, all structures in Examples are evaluated as OK even after being extended by 30%, whereas those in Comparative Examples 1-1 to 1-3 are evaluated as Broken NG. The structures in Comparative Examples 2-1 to 2-3 partly using the same materials as those in Examples are not broken, but are evaluated as NG. Thus, only those structures that include a plurality of laminated stretchable resin sheets 2 can be restored without being partially or completely broken after being extended.

(Example 4) Production of a Stretchable Display Member Using an Electrophoretic Solution Example 4-1

First, 0.1 g of carbon nanotube SWCNT, (IsoNanotubes-M available from NanoIntegris) is weighed and added to 500 g of an aqueous solution of sodium dodecyl sulfate with a concentration of 5 wt %. The resulting mixture is dispersed by ultrasonic waves for 24 hours, thereby preparing an aqueous solution dispersed with carbon nanotube (CNT) with a concentration of 0.02 wt %.

Next, this aqueous solution dispersed with CNT is coated on both sides of the sheet-shaped stretchable structure with hollows 7 formed in Example 1-1, dried at 120 degrees Celsius for 30 minutes to remove the solvent, thereby forming a conductive layer on each of the both sides of the structure.

Next, the following materials are put in a high-boiling-point solvent (Isoper-M available from Maruzen Petrochemical Co, Ltd.): positively charged black particles (carbon black available from Mitsubishi Chemical Corporation); negatively charged white particles (titanium oxide available from Tayca Corporation); dispersant (Solsperse 17000 available from Lubrizol Corporation); and a charge control agent (SPAN-85, a reagent). The resulting mixture is dispersed ultrasonically to prepare an electrophoretic solution. This solution is injected using a syringe into hollows 7 of the structure having the above-described conductive layers thereon.

Finally, the inlet is sealed using an UV adhesive, thereby forming a display element member.

Example 4-2

A display element member is formed in the same manner as in Example 4-1 except that the structure formed in Example 1-2 is used as a sheet-shaped stretchable structure with hollows 7.

Example 4-3

A display element member is formed in the same manner as in Example 4-1 except that the structure formed in Example 1-3 is used as a sheet-shaped stretchable structure with hollows 7.

Example 4-4

A display element member is formed in the same manner as in Example 4-1 except that the structure formed in Example 1-4 is used as a sheet-shaped stretchable structure with hollows 7.

Example 4-5

A display element member is formed in the same manner as in Example 4-1 except that the structure formed in Example 2-1 is used as a sheet-shaped stretchable structure with hollow 7.

Example 4-6

A display element member is formed in the same manner as in Example 4-1 except that the structure formed in Example 2-2 is used as a sheet-shaped stretchable structure with hollow 7.

Example 4-7

A display element member is formed in the same manner as in Example 4-1 except that the structure formed in Example 2-3 is used as a sheet-shaped stretchable structure with hollow 7.

Example 4-8

A display element member is formed in the same manner as in Example 4-1 except that the structure formed in Example 2-4 is used as a sheet-shaped stretchable structure with hollow 7.

Example 4-9

A display element member is formed in the same manner as in Example 4-1 except that the structure formed in Example 3-5 is used as a sheet-shaped stretchable structure with hollow 7.

Furthermore, for comparison, different display element members are prepared by sealing the electrophoretic solution prepared by the same method as in Example 4-1 into the sheet-shaped structures formed in Comparative Examples 1-1 to 1-3 and 2-1 to 2-3. The obtained display element members, however, have been confirmed to have been broken or have not been restored as shown in Table 1.

(Evaluation: Confirmation of Display Properties)

A voltage is applied to the conductive layers of each of the display element members formed in Examples 4-1 to 4-9 and it has been confirmed that each of the display element members displays in white on the negative side and in black on the positive side. It has also been confirmed that these display element members provide similar display capabilities even when extended by 10% or 30% and also when restored after being extended.

Figure 13A:
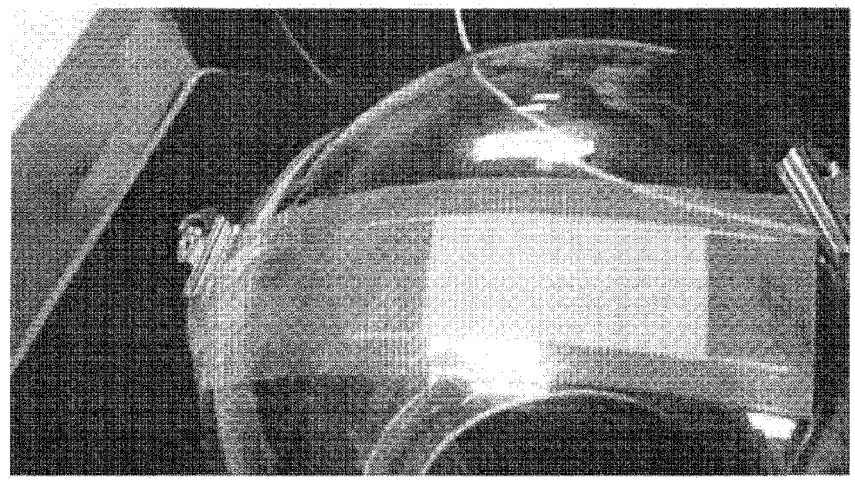
FIG. 13A shows a photo showing the results of display properties evaluated in Example 4 according to the first exemplary embodiment of the present disclosure.
Figure 13B:
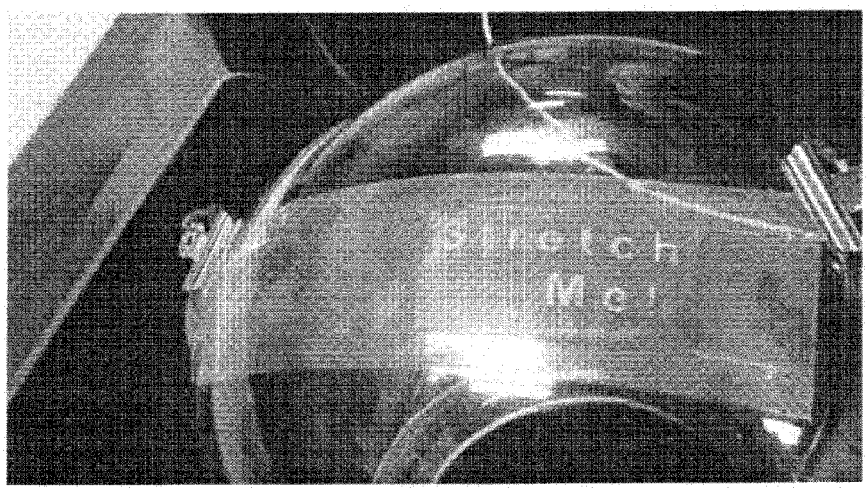
FIG. 13B shows a photo showing the stretchable structure shown in FIG. 13A when a polarity-reversed voltage is applied.

The conductive layer can be partially patterned by laser etching so as to provide displays shown in FIGS. 13A and 13B. FIG. 13A shows a white display by applying a potential of −15V to the front surface and a potential of +15V to the rear surface, respectively. In contrast, when a potential of +15V is applied to the front surface and a potential of −15V is applied to the rear surface by reversing the polarity of the applied voltage, the conductive surface is displayed in black, allowing laser-patterned letters to appear as shown in FIG. 13B.

(Example 5) Production of a Stretchable Display Member Using a Cholesteric Liquid Crystal Example 5-1

The aqueous solution dispersed with CNT formed in the same manner as in Example 4-1 is coated on both sides of the sheet-shaped structure with hollow 7 formed in Example 3-1. This structure is dried at 120 degrees Celsius for 30 minutes to remove the solvent, thereby forming a conductive layer on each of the both sides of the structure.

Next, a cholesteric liquid crystal (RDP-A3435CH1 available from DIC corporation) is injected using a syringe into hollow 7 of the structure including the conductive layer. The inlet is sealed using an UV adhesive, thereby forming a display element member.

Example 5-2

A display element member is formed in the same manner as in Example 5-1 except that the structure formed in Example 3-2 is used as the sheet-shaped stretchable structure with hollow 7.

Example 5-3

A display element member is formed in the same manner as in Example 5-1 except that the structure formed in Example 3-3 is used as the sheet-shaped stretchable structure with hollow 7.

Example 5-4

A display element member is formed in the same manner as in Example 5-1 except that the structure formed in Example 3-4 is used as the sheet-shaped stretchable structure with hollow 7.

(Evaluation: Confirmation of Display Properties)

A voltage is applied to the conductive layers of the display members formed in Examples 5-1 to 5-4 and it has been confirmed that the display members display in white on the positive side and in black on the negative side. It has also been confirmed that these display members provide similar display capabilities even when extended by 10% or 30% and also when restored after being extended.

Figure 6:
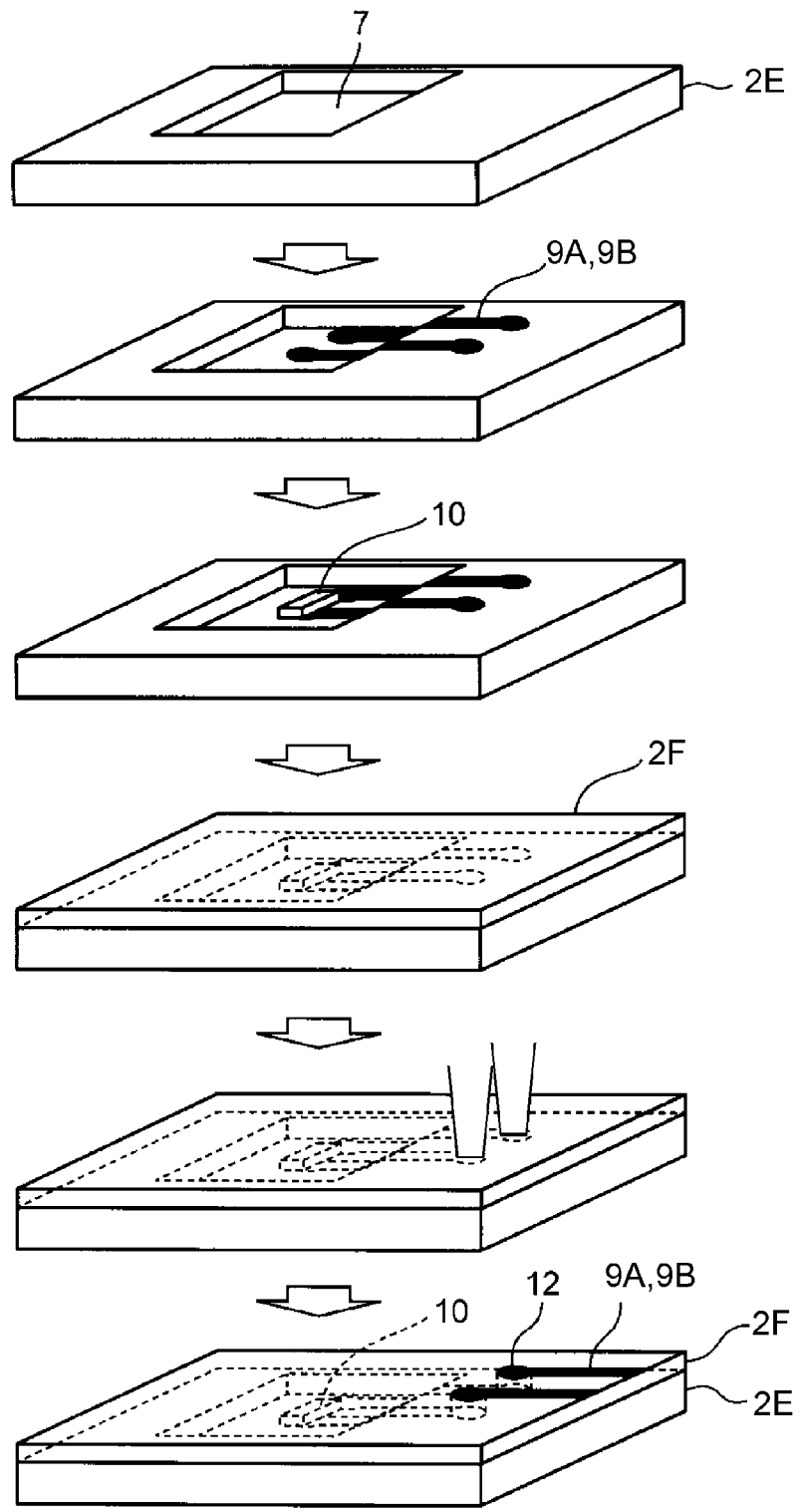
FIG. 6 shows the procedure for manufacturing a stretchable electronic circuit member including an electronic component according to the first exemplary embodiment of the present disclosure.

(Example 6) Production of a Stretchable Electronic Circuit Member Including an Electronic Component A stretchable electronic circuit member of Example 6, which includes an electronic component, is formed according to the procedure shown in FIG. 6.

Example 6-1

One flat stretchable resin sheet 2F with a thickness of 50 micrometers is formed in the same manner as in Example 1-1. In addition, stretchable resin sheet 2E with a recessed pattern is prepared. The recessed pattern is molded in a mold with a raised pattern in such a manner that the recessed parts have a height of 200 micrometers.

Meanwhile, a stretchable conductive paste is prepared by filling urethane resin (HUX-561 available from Adeka Corporation) with 90 wt % of silver particles with a diameter of 2.1 micrometers. This conductive paste is formed into wires 9A and lands 9B on the surface of sheet 2E shown in FIG. 6. Next, LED 10 is installed in hollow 7 and is connected to lands 9B using an electrically conductive adhesive.

Next, sheets 2F and 2B are bonded together and heated at 170 degrees Celsius for one hour, thereby forming an electronic circuit member in which LED 10 is sealed. Finally, after the sheets are laser-chilled, vias 12 and wires 9A are printed using the above-described stretchable conductive paste and then connected to an external power supply.

Example 6-2

An electronic circuit member is formed in the same manner as in Example 6-1 except that the sheet-shaped stretchable structure with hollow 7 is formed by using the materials and method employed in Example 1-2.

Example 6-3

An electronic circuit member is formed in the same manner as in Example 6-1 except that the sheet-shaped stretchable structure with hollow 7 is formed by using the materials and method employed in Example 1-3.

Example 6-4

An electronic circuit member is formed in the same manner as in Example 6-1 except that the sheet-shaped stretchable structure with hollow 7 is formed by using the materials and method employed in Example 1-4.

(Evaluation: Confirmation of the Behavior of the Electronic Circuit Member)

A current is applied to the circuits of the electronic circuit members formed in Examples 6-1 to 6-4 and it has been confirmed that LED 10 operates properly. It has also been confirmed that the electronic circuit members operate properly even when extended by 10% or 30% and also when restored after being extended.

The aforementioned results indicate that the stretchable structure of the present exemplary embodiment is useful as various electronics elements.

Second Exemplary Embodiment

Prior to describing a second exemplary embodiment of the present disclosure, problems associated with the conventional techniques will now be briefly described. Thermosetting resins are widely used, for example, as electronic and optical materials because of their excellence in heat resistance, chemical resistance, moldability, insulation reliability, etc. Among thermosetting resins, epoxy resins are used for various applications. Epoxy resins are excellent in the above-described properties, but their hardness and inflexibility are also well known. Because of these undesirable properties, epoxy resins can be deformed or broken due to external stress or heat stress.

Examples of more flexible materials include the following: silicone resins, urethane resins, thermoplastic resins such as polyethylene, and various rubber materials. Regarding the flexibility of resin materials, not only a low elastic modulus and a high tensile elongation, but also excellent restoration properties after extension are required to be used as variousapplications.

Meanwhile, recent resin materials need to have stress relaxation properties as well as flexibility. Having a large residual stress when deformed under stress means having a large restoring force. Consequently, a large residual stress causes exfoliation between components or their breakage. To avoid this, resin materials need to have the property of reducing an applied stress and hence the residual stress, that is, to have excellent stress relaxation properties.

Urethane resins and silicone resins described in the aforementioned Unexamined Japanese Patent Publication No. 2012-63437 and No. 2012-27488, however, are known to be poor in stress relaxation properties although they are excellent in tensile elongation and restoration properties.

In the electronics field, every component should have such properties as heat resistance of its material and adhesion with other components. Thermoplastic resins such as urethane resins are known to reversibly melt when heated, whereas silicone resins are known to have low surface tension. These properties of the conventional resins, such as melting with heat and low surface tension may make it difficult to ensure adhesion with other components.

As a result, display devices including these resins are easily exfoliated or broken due to residual stress because of elastic deformability or low surface tension when caused to fit a curved surface or to accommodate large deformation.

These problems hold true for other rubber materials, and highly restorable materials generally have low stress relaxation properties. On the other hand, polyethylene and other thermoplastic materials are used in various fields by taking advantage of their flexibility and high tensile elongation. However, the tensile elongation is in the range only from several to several dozen percent, and at stresses exceeding the yield point, these thermoplastic materials are plastically deformed and extended. As a result, these materials cannot be restored after extension (due to many residual strains) although having excellent stress relaxation properties.

Resin materials have been extensively studied concerning their low elasticity, softness with high extensibility, and restoration properties. However, as compared with these properties, it has rarely been reported to successfully improve stress relaxation properties. The reason for this is considered that stress relaxation is caused by plastic deformation due to creep phenomena and that it is impossible to restore plastically deformed resin materials.

Hereinafter, the second exemplary embodiment of the present disclosure will now be described, but the present disclosure is not limited to this embodiment. The present exemplary embodiment deals with materials having the following properties: high stress relaxation properties when stretched; excellent restoration properties after extension; high ability to prevent exfoliation and breakage of components due to residual stress; and high adhesion.

The stretchable resin sheet, which is the cured material of the resin composition used in the electronics element of the present exemplary embodiment, has elastic deformability and few residual strains and also has stress relaxation properties. More specifically, when a predetermined amount of deformation is of the stretchable resin sheet, the stress causing the deformation decreases with time. When the stress reduces to zero, the stretchable resin sheet is restored substantially to its original shape.

Thus, materials having flexibility and stress relaxation properties can be achieved by balancing high stress relaxation properties when stretched and excellent restoration properties after extension.

In the present exemplary embodiment, the term "elastic deformability and few residual strains" specifically means to be plastically non-deformable and the residual strain rate is preferably not more than 3%. The term "to have stress relaxation properties" specifically means to have the ability to reduce an applied force (for example, tensile force) so as to reduce the residual stress.

In the present exemplary embodiment, for convenience, the residual strain and stress relaxation properties of the resin composition for stretchable resin sheet are defined as stress relaxation rate R and residual strain rate alpha, respectively, which are measured by an after-mentioned extension-restoration test.

In the stretchable resin sheet as the cured material of the resin composition of the present exemplary embodiment, it is preferable that the stress relaxation rate R be in a range from 20% to 95%, inclusive, and the residual strain rate alpha be in a range from 0% to 3%, inclusive, and it is more preferable that the stress relaxation rate R be in a range from 30% to 60%, inclusive, and the residual strain rate alpha be in a range from 0% to 1.5%, inclusive. When these conditions are satisfied, the resin composition for stretchable resin sheet of the present exemplary embodiment can have both high stress relaxation properties when stretched and excellent restoration properties after extension.

A resin composition of which cured material has the stress relaxation rate and the residual strain rate within the above-mentioned ranges can be formed into a cured material having both high stress relaxation properties when stretched and excellent restoration properties after extension, thereby having high flexibility and excellent stress relaxation properties.

In the present exemplary embodiment, the "cured material" of the resin composition for stretchable resin sheet means a resin that is obtained by subjecting a curable resin composition to a curing reaction with sufficient energy such as heat or light. The cured material of the present exemplary embodiment does not become plastic again by heating. Thus, the cured material is heat resistant, insoluble, and infusible.

(Extension-Restoration Test)

In the extension-restoration test conducted in the present exemplary embodiment, pieces of the stretchable resin sheet as the cured material of the resin composition for stretchable resin sheet are subjected to an extension process and a restoration process under the conditions shown below, using a tensile-compression tester according to ISO 3384. Then, the stress relaxation rate R and the residual strain rate alpha are calculated by the calculation methods shown below. Each of the stretchable resin sheet pieces to be tested has a thickness of 50 micrometers and a shape of dumbbell No. 6 (the width of the portion to be measured: 4 mm, and the length of the parallel portion: 25 mm). The tensile-compression tester can be, for example, AutoGraph (type: AGS-X) available from Shimadzu Corporation.

(The Extension Process Conditions)

Deflection is corrected with a force of not more than 0.05N in order to eliminate the deflection developed when each test piece is attached to a cramp under the following conditions:

speed of testing: extended at 25 mm/min from a non-stretched state to 25%
temperature: 23 degrees Celsius
extension/holding conditions: holding for 5 minutes at 25% extension (The Restoration Process Conditions)
  speed of testing: 0.1 mm/min until the tensile force reaches 0±0.05 N
  temperature: 23 degrees Celsius
  Stress relaxation rate R calculation method: the tensile force is measured at the time when the extension process is completed, and defined as initial tensile force $F_{A0}$. After the amount of strain is held for 5 minutes under the above extension/holding conditions, the tensile force is measured and defined as $F_A(t5)$.

The stress relaxation rate R is calculated by the formula shown below.

$$R = \frac{F_{A0} - F_A(t5)}{F_{A0}} \times 100$$

Residual strain rate alpha calculation method: the amount of strain is measured at the time when the tensile force reaches 0±0.05 N in the restoration process, and the amount of strain is defined as the residual strain rate alpha.

Figure 14:
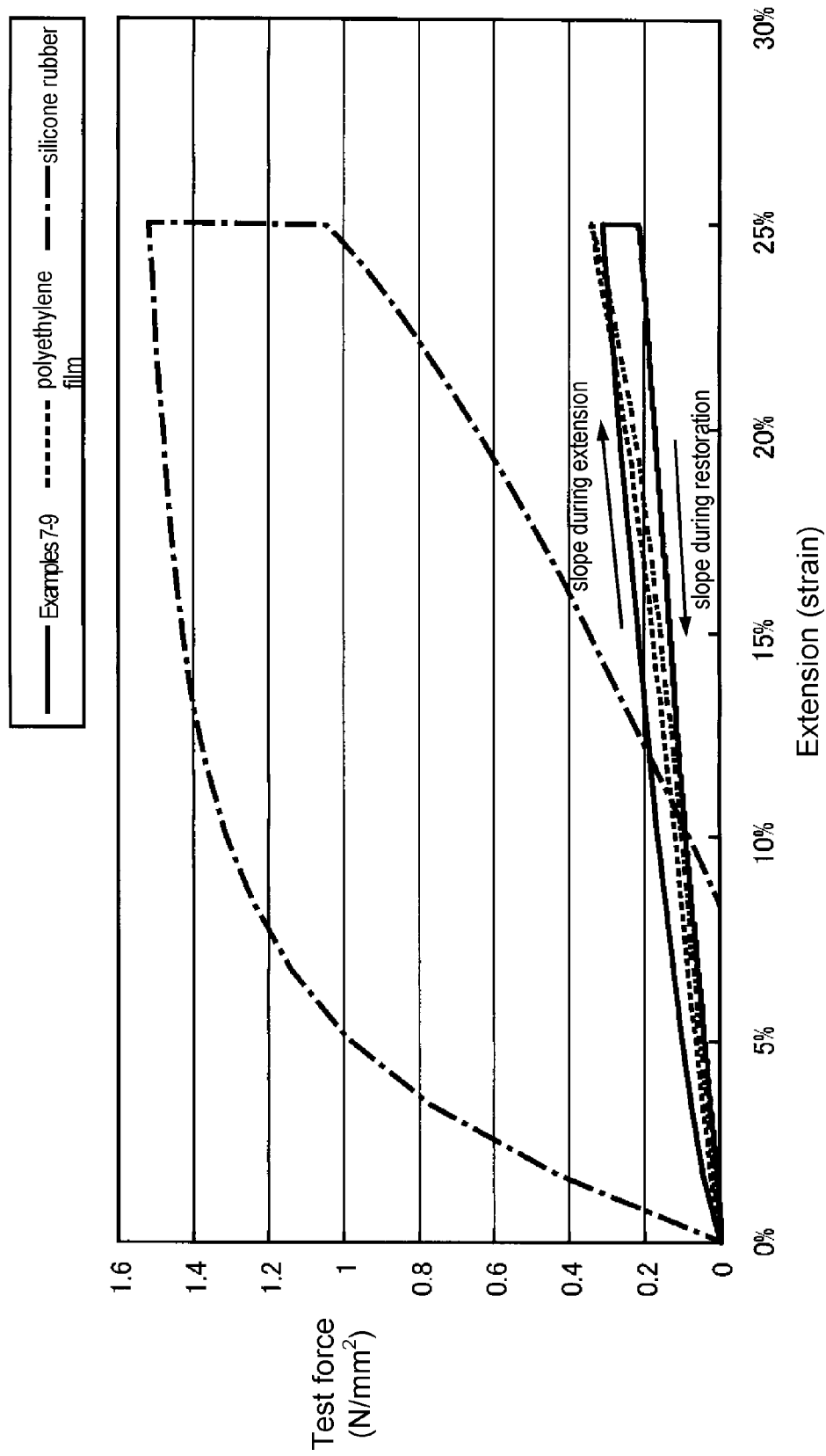
FIG. 14 is a graph showing the behavior of an extension-restoration test applied to the stretchable resin sheet of a second exemplary embodiment of the present disclosure and other stretchable resin sheets used for comparison.

In the above extension-restoration test, the cured material of the resin composition of the present exemplary embodiment (the resin sheet obtained by curing the resin composition of Example 7-2 described later) shows an extension (strain) restoration behavior with respect to the tensile force as shown by a curved or nearly straight line in the graph shown in FIG. 14. In FIG. 14, the vertical axis represents a tensile force (test force) expressed in N/mm$^2$, and the horizontal axis represents the amount of extension (strain) expressed in %. The term "the amount of extension" means a substantial amount of strain of the stretchable resin sheet.

FIG. 14 also shows, for comparison, the results of the extension-restoration test for evaluating the behavior of two conventional resin films. One is a silicone film made of elastically deformable resin (the resin sheet obtained by curing the resin composition of Comparative Example 7-4 described later), and the other is a polyethylene film made of plastically deformable resin (the resin sheet obtained by curing the resin composition of Comparative Example 7-5 described later). For either film, the upper curved or nearly straight line represents extension in the extension process, and the lower curved or nearly straight line represents restoration (return from the extension) in the restoration process.

As shown in FIG. 14, the stretchable resin sheet of the present exemplary embodiment is extended up to 25% according to the tensile force in the extension process, is retained for 5 minutes. However, the stretchable resin sheet of the present exemplary embodiment reduces the stress while retained in the extension state, and is restored until the tensile force reaches 0±0.05 N in the restoration process.

The stretchable resin sheet of the present exemplary embodiment is restored until the residual strain is reduced to about 1% after the extension-restoration test. Thus, the stretchable resin sheet has very low residual strain rate.

On the other hand, in the polyethylene film, the residual strain is only reduced to about 8.4% after the extension-restoration test. Thus, the polyethylene film has high residual strain rate. When retained for 5 minutes after the extension process, the stress of the polyethylene film is reduced by about 30%, while the stress of the extended silicone film is hardly reduced.

In contrast, the stress of the resin composition of the present exemplary embodiment is reduced by about 30%.

The behavior of the stretchable resin sheet of the present exemplary embodiment shown in FIG. 14 also indicates that the cured material of the resin composition of the present exemplary embodiment has flexibility, excellent restoration properties after extension, and also excellent stress relaxation properties. These are unique and advantageous properties not observed in the conventional elastically and plastically deformable resins. Therefore, the resin composition for stretchable resin sheet of the present exemplary embodiment can exercise its properties in flexible display devices and other similar devices.

As another preferred exemplary embodiment, the resin composition preferably contains an uncross-linked curing resin component and has the properties of being remelted or softened when heated and a thermosetting property or a photocurable property. In short, it is preferable that the resin composition be a semi-cured film-like resin composition. These configurations allow preparing a resin composition with excellent adhesion and moldability.

The resin composition containing uncross-linked curing resin components, that is, unreacted functional groups in reactive resin components allows the unreacted functional groups to bind covalently to, for example, hydroxyl groups existing on a surface of a laminated plate, a metal, or glass. This improves the adhesion between the resin materials and them. More specifically, it is preferable that some of the functional groups of the reactive resin components be cross-linked and the remaining large number of functional groups be uncross-linked. This chemical structure allows the resin composition for stretchable resin sheet of the present exemplary embodiment to be formed into a semi-cured base member or film that can be easily handled when bonded or laminated.

Because of having the property of being remelted or softened when heated, the resin composition for stretchable resin sheet of the present exemplary embodiment can be molded into various complicated shapes. Resin compositions having a melt viscosity of 100 to 100000 cps at 80 to 150 degrees Celsius desirably have excellent moldability. Resin compositions having a melt viscosity of 500 to 50000 cps at 80 to 130 degrees Celsius desirably have excellent comp actability (repletion) because they are unlikely to have voids during molding.

It is also preferable that the resin composition for stretchable resin sheet contain a curing agent and epoxy resin as thermosetting resin. This allows the stretchable resin sheet to be excellent not only in electrical insulation, heat resistance, chemical resistance, and toughness, but also in workability because of its compatibility with various resins.

The resin composition for stretchable resin sheet can include, for example, at least the following: (A) polyrotaxane, (B) thermosetting resin, and (C) a curing agent. If necessary, (D) a cross-linking agent may be added. Each of these components will now be described in detail.

Component A: Polyrotaxane

A polyrotaxane has a chemical structure in which a linear axle molecule penetrates circular molecules and the terminals of the linear axle molecule are blocked to prevent dissociation of the circular molecules. More specific examples include the polyrotaxane disclosed in Japanese Patent No. 4482633.

Examples of the polyrotaxane that can be used in the present exemplary embodiment include the following compounds: those in which an axle molecule having terminal functional groups is enclathrated in a skewered state in circular molecules, and the terminal functional groups are chemically modified with a blocking group bulky enough to prevent dissociation of the circular molecules. Any polyrotaxanes with such a structure can be used regardless of the structure and type of the molecules composing them or the enclathration rate and the synthesis method of the circular molecules.

The axle molecule that can be contained in a polyrotaxane is not particularly limited as long as it has a molecular weight of not less than 10000 and each of the terminals can be chemically modified with a blocking group. Examples of such an axle molecule include the following: polyvinyl alcohol, polyvinylpyrrolidone, poly(meth)acrylic acid cellulosic resin, polyacrylamide, polyethylene oxide, polyethylene glycol, polypropylene glycol, polyvinyl acetal-based resin, polyvinyl methyl ether, polyamine, polyethylenimine, casein, gelatin, starch, polyolefin, polyester, polyvinyl chloride, polystyrene, acrylonitrile-styrene copolymer and other copolymers, acrylic-based resin, polycarbonate, polyurethane, polyvinyl butyr al, polyisobutylene, polytetrahydrofuran, polyamide, polyimide, polydiene, polysiloxane, polyurea, polysulfide, polyphosphazene, polyketone, polyphenylene, polyhaloolefin, and their derivatives. Among them, polyethylene glycol is preferable.

Any circular molecule can be contained in the polyrotaxane as long as it allows a polymer molecule to pass through it and has at least one reaction group so as to react with a cross-linking agent. Examples of such a circular molecule include the following: cyclodextrins, crown ethers, cryptands, macrocyclic amines, calixarenes, and cyclophanses. Among them, cyclodextrins and substituted cyclodextrins are preferable. More preferable examples are those in which a reaction group (functional group) is introduced into the substituted structure.

Preferable examples of the functional group to be introduced into the circular molecules of the polyrotaxane include the following: hydroxyl group, carboxyl group, acrylic group, methacrylic group, epoxy group, and vinyl group.

The functional group introduced into the circular molecules can cross-link either the circular molecules, or the polyrotaxane and the resin via a cross-linking agent. The resin cross-linked with the polyrotaxane described above has flexibility.

The configuration (end-capping group) to block the terminals of the polyrotaxane used in the present exemplary embodiment is not particularly limited as long as it is bulky enough to prevent dissociation of the circular molecules. Preferable examples of such a group include the following: cyclodextrin group, adamantane group, dinitrophenyl group, and trityl group.

The circular molecule to be used is not particularly limited as long as it can enclathrate chain polymer molecules in its ring. A preferable example of the circular molecule is cyclodextrin. It is preferable that each of the circular molecules has a functional group. It is also preferable that the functional group be one of hydroxyl group, acrylic group, and methacrylic group.

The polyrotaxane used in the present exemplary embodiment can be synthesized by well-known methods such as those shown in International Publication No. 2001/83566, Unexamined Japanese Patent Publication No. 2005-154675, and Japanese Patent No. 4482633. Alternatively, any commercially available polyrotaxanes can be used, such as SeRM super polymer SH3400P and SH2400P available from Advanced Softmaterials Inc.

Component B: Thermosetting Resin

As the thermosetting resin, epoxy resin, phenol resin, polyimide resin, urea resin, melamine resin, unsaturated polyester, and urethane resin can be used without any limitation. Among them, epoxy resin is preferable.

Examples of the epoxy resin include the following: bisphenol A epoxy resin, bisphenol F epoxy resin, bisphenol S epoxy resin, aralkyl epoxy resin, phenol novolac epoxy resin, alkyl phenol novolac epoxy resin, biphenol epoxy resin, naphthalene epoxy resin, dicyclopentadiene epoxy resin, an epoxy compound of a condensation product of a phenol and an aromatic aldehyde with a phenolic hydroxyl group, triglycidyl isocyanurate, and alicyclic epoxy resin. They may be used alone or in combination of two or more thereof depending on the situation.

The epoxy resin more preferably has two or more epoxy groups and three or more methyl groups per molecule and has a molecular weight of not less than 500. The epoxy resin can be any commercially available one such as follows: JER1003 (available from Mitsubishi Chemical Corporation, which is bifunctional and has 7 to 8 methyl groups and a molecular weight of 1300); EXA-4816 (available from DIC corporation, which is bifunctional and has a molecular weight of 824 and many methyl groups); and YP-50 (available from Nippon Steel & Sumikin Chemical Co., Ltd., which is bifunctional and has molecular weight of 60,000 to 80,000 and many methyl groups).

It is preferable that the curing resin which contain Components A and B be at least partially uncross-linked. In other words, it is preferable that the functional group of Component A be uncross-linked, and at least one and preferably both of the epoxy groups of Component B be uncross-linked. It is more preferable that some of the functional groups and/or the epoxy groups contained in the reactive resin (curing resin) composed of Components A and B be cross-linked, and the remaining large number of groups be uncross-linked. This allows the resin composition to be formed into a semi-cured base member or film that can be easily handled when bonded or laminated.

The resin composition in which the curing resin is in an uncross-linked state (semi-cured state) can be prepared by adjusting the heating and drying conditions as described later.

Component C: Curing Agent

The curing agent is not particularly limited as long as it can function for the thermosetting resin of Component B. Preferable examples of the curing agent for the epoxy resin include the following: phenol resin, amine-based compounds, acid anhydrides, imidazole-based compounds, sulfide resins, and dicyandiamides. light (ultraviolet) curing agents and thermal cationic curing agents can be used. They may be used alone or in combination of two or more thereof depending on the situation.

Component D: A Cross-Linking Agent

It is possible to add a cross-linking agent to the resin composition for stretchable resin sheet of the present exemplary embodiment containing the polyrotaxane. The cross-linking agent is not particularly limited as long as it can form a cross-linking structure between at least part (at least one reaction group in the circular molecules of the polyrotaxane) of the circular molecules of the polyrotaxane and Component C of the curing agent.

Examples of the cross-linking agent include the following: isocyanate, cyanuric chloride, trimesoyl chloride, terephthaloyl chloride, epichlorohydrin, dibromobenzene, glutaraldehyde, phenylene diisocyanate, tolylene diisocyanate, divinyl sulfone, 1, 1-carbonyldiimidazole, and alkoxysilane. One example of the isocyanates is DN-950 (available from DIC corporation).

In the present exemplary embodiment, the number of the functional groups contained in the cross-linking agent is not limited. It is preferable, however, that the cross-linking agent has two or more functional groups per molecular in order to cross-link either the circular molecules of the polyrotaxane, or the circular molecules and an after-mentioned resin. When the cross-linking agent has two or more functional groups, the groups may be the same or different from each other.

It is more preferable that the cross-linking agent be compatible with the polyrotaxane. In the case of using, as Component A, a polyrotaxane containing circular molecules having hydroxyl group, it is preferable to use an isocyanate or its derivative as the cross-linking agent. The isocyanate resin can be any kind, such as blocked isocyanate resin obtained by blocking the isocyanate groups.

On the other hand, in the case of using, as Component A, a polyrotaxane containing circular molecules having either acrylic group or methacrylic group, acrylic resin can be added as reactive resin. The acrylic resin can also be of any type.

The contents of the components in the resin composition of the present exemplary embodiment are not limited as long as the effects of the present disclosure can be provided. More specifically, Component A is preferably 10 to 80 parts by weight, and more preferably 30 to 50 parts by weight; Component B is preferably 10 to 89.9 parts by weight, and more preferably 30 to 50 parts by weight; Component C is preferably 0.1 to 30 parts by weight, and more preferably 0.1 to 20 parts by weight, with respect to 100 parts by weight of the total amount of Components A to C. In the case of using the isocyanate resin as the cross-linking agent of Component D, the content of the isocyanate resin to be added to the polyrotaxane of Component A is 0 to 50 parts by weight, and preferably 10 to 40 parts by weight.

As long as being able to ensure the effects of the present disclosure, the resin composition for stretchable resin sheet of the present exemplary embodiment can contain other additives such as a curing catalyst (curing accelerator), a flame retardant, a flame retardant auxiliary agent, a leveling agent, and a colorant according to the need.

The method of preparing the resin composition for stretchable resin sheet of the present exemplary embodiment containing the polyrotaxane of Component A is not particularly limited. For example, a polyrotaxane, a curing agent, a cross-linking agent, thermosetting resin, and a solvent can be uniformly mixed to prepare the resin composition. The solvent can be of any type such as, toluene, xylene, methyl ethyl ketone, and acetone. These solvents may be used alone or in combination of two or more thereof. It is also possible to add an organic solvent to modify the viscosity, and various additives according to the need.

The obtained resin composition for stretchable resin sheet containing the polyrotaxane of Component A is heat-dried for curing while the solvent is being evaporated off, thereby forming a stretchable resin sheet.

The resin composition for stretchable resin sheet containing the polyrotaxane of Component A can be heat-dried using any of the conventional and improved methods, devices, and conditions. The temperature and time of the heating can be properly determined according to the used cross-linking agent and the solvent. For example, the resin composition for stretchable resin sheet can be obtained by heat-drying for 60 to 120 minutes at 50 to 200 degrees Celsius for curing the resin composition.

Other examples of the resin composition for stretchable resin sheet of the present exemplary embodiment include a resin composition containing Components E and F described below. Component E is an epoxy resin having an alkylene oxide-modified group having 2 to 3 carbon atoms. In this epoxy resin, 4 mol or more of the modified groups, and not less than 2 mol of epoxy groups are contained per mol of epoxy molecules. The epoxy equivalent weight is not less than 450 eq/mol. Meanwhile, Component F is a curing agent. Examples of Components E and F will now be described as follows.

Examples of the epoxy resin of Component E include the following: a propylene oxide adduct of bisphenol A epoxy resin (EP4003S available from ADEKA Corporation), and an ethylene oxide adduct of hydroxyphenyl fluorene epoxy resin (EG-280 available from Osaka Gas Chemicals Co., Ltd.).

As long as being able to ensure the effects of the present disclosure, the resin composition for stretchable resin sheet of the present exemplary embodiment containing the epoxy resin of Component E may further contain an epoxy resin other than Component E. Examples of the epoxy resin other than Component E include the following: bisphenol A epoxy, bisphenol F epoxy, bisphenol S epoxy, aralkyl epoxy, aliphatic epoxy, and alicyclic epoxy. The content of Component E in the entire epoxy resin component is approx. 60 to 99 wt %, and preferably approx. 80 to 95 wt %.

The curing agent of Component F can be any well-known curing agent for epoxy resin. To be more specific, phenol resins, acid anhydrides, and sulfonium salt are preferable because of their curability. If necessary, it is also possible to combine a curing accelerator such as imidazole-based compounds, together with two or more selected from the above-mentioned curing agents.

The phenol resin curing agents can be of any of monomers, oligomers, and polymers as long as it has two or more phenolic hydroxyl groups per molecule. The molecular weight and molecular structure of the phenol resin curing agent are not particularly limited One example of the phenol resin curing agent is a resin obtained by condensing or co-condensing a phenol, a naphthol such as an α-naphthol, a β-naphthol, and a dihydroxynaphthalene, and a compound having an aldehyde group such as formaldehyde under an acidic catalyst. Another example is a phenol aralkyl resin synthesized from a phenol and/or a naphthol and either dimethoxyparaxylene or bis(methoxymethyl)biphenyl. Examples of the phenol include the following: phenols such as phenol novolac resin and cresol novolac resin, cresol, resorcin, catechol, bisphenol A, bisphenol F, phenylphenol, and aminophenol. They may be used alone or in combination of two or more thereof.

Examples of the acid anhydride curing agent include the following: maleic anhydride, succinic anhydride, itaconic anhydride, citraconic anhydride, phthalic anhydride, 1,2,3,6-tetrahydrophthalic anhydride, 3,4,5,6-tetrahydrophthalic anhydride, hexahydrophthalic anhydride, 4-methylhexahydrophthalic anhydride, 3-methyl-1,2,3,6-tetrahydrophthalic anhydride, 4-methyl-1,2,3,6-tetrahydrophthalic anhydride, and methyl-3,6-endomethylene-1,2,3,6-tetrahydrophthalic anhydride.

Examples of the sulfonium salt include the following: alkylsulfonium salt, benzylsulfonium salt, dibenzylsulfonium salt, and substituted benzylsulfonium salt. Examples of the alkyl sulfonium salt include the following: 4-acetophenyldimethyl sulfonium hexafluoroantimonate, 4-acetoxyphenyklimethyl sulfonium hexafluoroarsenate, dimethyl-4-(benzyloxycarbonyloxy)phenyl sulfonium hexafluoroantimonate, dimethyl-4-(benzoyloxy)phenyl sulfonium hexafluoroantimonate, dimethyl-4-(benzoyloxy)

phenyl sulfonium hexafluoroarsenate, and dimethyl-3-chloro-4-acetoxyphenyl sulfonium hexafluoroantimonate. Examples of the benzylsulfonium salt include the following: benzyl-4-hydroxyphenylmethyl sulfonium hexafluoroantimonate, benzyl-4-hydroxyphenylmethyl sulfonium hexafluorophosphate, 4-acetoxyphenylbenzylmethyl sulfonium hexafluoroantimonate, benzyl-4-methoxyphenylmethyl sulfonium hexafluoroantimonate, benzyl-2-methyl-4-hydroxyphenylmethyl sulfonium hexafluoroantimonate, benzyl-3-chloro-4-hydroxyphenylmethyl sulfonium hexafluoroarsenate, and 4-methoxybenzyl-4-hydroxyphenylmethyl sulfonium hexafluorophosphate. Examples of the dibenzylsulfonium salt include the following: dibenzyl-4-hydroxyphenyl sulfonium hexafluoroantimonate, dibenzyl-4-hydroxyphenyl sulfonium hexafluorophosphate, 4-acetoxyphenyldibenzyl sulfonium hexafluoroantimonate, dibenzyl-4-methoxyphenyl sulfonium hexafluoroantimonate, dibenzyl-3-chloro-4-hydroxyphenyl sulfonium hexafluoroarsenate, dibenzyl-3-methyl-4-hydroxy-5-tert-butylphenyl sulfonium hexafluoroantimonate, and benzyl-4-methoxybenzyl-4-hydroxyphenyl sulfonium hexafluorophosphate. Examples of the substituted benzylsulfonium salt include the following: p-chlorobenzyl-4-hydroxyphenylmethyl sulfonium hexafluoroantimonate, p-nitrobenzyl-4-hydroxyphenylmethyl sulfonium hexafluoroantimonate, p-chlorobenzyl-4-hydroxyphenylmethyl sulfonium hexafluorophosphate, p-nitrobenzyl-3-methyl-4-hydroxyphenylmethyl sulfonium hexafluoroantimonate, 3,5-dichlorobenzyl-4-hydroxyphenylmethyl sulfonium hexafluoroantimonate, and o-chlorobenzyl-3-chloro-4-hydroxyphenylmethyl sulfonium hexafluoroantimonate.

One example of the polyfunctional phenolic curing agent is GPH-103 (available from Nippon Kayaku Co., Ltd., which is biphenyl aralkyl phenol). One example of the acid anhydride-based curing agent is YH-306 (available from Mitsubishi Chemical Corporation). One example of the imidazole-based curing accelerator is 2E4MZ (available from Shikoku Chemicals Corporation, which is 2-ethyl-4-methylimidazole).

The contents of the components in the resin composition for stretchable resin sheet containing the epoxy resin of Component E are not limited as long as the effects of the present disclosure can be provided. More specifically, Component E is preferably 50 to 99 parts by weight, and more preferably 60 to 80 parts by weight; and Component F is preferably 1 to 50 parts by weight, and more preferably 1 to 40 parts by weight, with respect to 100 parts by weight of the total amount of the resin composition for stretchable resin sheet.

As long as being able to ensure the effects of the present disclosure, the resin composition for stretchable resin sheet containing Component E can contain other additives such as a curing catalyst (curing accelerator), a flame retardant, a flame retardant auxiliary agent, a leveling agent, and a colorant according to the need.

The method of preparing the resin composition for stretchable resin sheet of the present exemplary embodiment containing Component E is not particularly limited. For example, epoxy resin, a curing agent, and a solvent can be uniformly mixed. The solvent can be of any type such as, toluene, xylene, methyl ethyl ketone, acetone, DMF, NPM, or ethyl acetate. These solvents may be used alone or in combination of two or more thereof. It is also possible to add an organic solvent to modify the viscosity, or various additives according to the need.

The obtained resin composition for stretchable resin sheet containing Component E is heat-dried for curing while the solvent is being evaporated off, thereby forming a stretchable resin sheet.

The resin composition for stretchable resin sheet containing Component E can be heat-dried using any of the conventional and improved methods, devices, and conditions. The temperature and time of the heating can be properly determined according to the used cross-linking agent and the solvent. For example, the resin composition for stretchable resin sheet can be obtained by heat-drying for 60 to 180 minutes at 130 to 200 degrees Celsius for curing the resin composition.

In the drying conditions of the resin composition for stretchable resin sheets prepared in different manners as above, the volatilization rate of the solvent is much faster than the rate of the curing reaction of the resin, and the heat-drying process is suspended when the sheet is dried enough, thereby, a semi-cured film-like resin composition can be formed. The "semi-cured" state means that the resin sheet contains unreacted resin, which may be softened or remelted by heating. The film-like resin composition in the semi-cured state (what is called, a prepreg state) can be thermally molded by using metal molds or the like. In this case, the semi-cured (uncross-linked) resin is considered to be covalently bonded to the hydroxyl groups on the surface of the object to be bonded, thereby providing high adhesive strength.

In the present exemplary embodiment, the semi-cured film-like resin composition can be dried using any of the conventional and improved methods, devices, and conditions. The temperature and time of the drying can be properly determined according to the used cross-linking agent and the solvent. For example, a semi-cured film-like resin composition for stretchable resin sheet can be obtained by heat-drying for 2 to 15 minutes at 80 to 130 degrees Celsius.

The semi-cured film-like resin composition can be used as a support body or can be bonded between layers so as to buffer the stress or can be bonded to the surface of a layer so as to protect the surface. In addition, the semi-cured film-like resin composition can be cured by heat or light energy so as to provide sufficient heat resistance and adhesion, thereby forming a stretchable structure having a buffer layer or a protective layer with excellent stress relaxation and few residual strains. It is also possible to bond an object to be supported to the film-like resin composition of the present exemplary embodiment and to cure the resin composition with heat or light such as ultraviolet.

It is further preferable that the resin composition for stretchable resin sheet of the present exemplary embodiment contain filler. Using filler allows controlling not only the resin strength and the thermal expansion coefficient, but also water-absorbing properties and electroconductivity.

The filler can be of various types depending on the application. It is preferable that the filler contain at least one selected from organic fibers, carbon fibers, glass fibers, and metal fibers. Using such filler reinforces the resin strength, allowing the stretchable resin sheet to be pliable and tough. Using such filler also facilitates the control of the linear expansion, making the stretchable resin sheet easier to deal with, more electrically conductive and less expensive. If needed, these fibers can be surface-treated with a coupling agent or surface-modified by graft polymerization by any of conventional and improved methods. The fiber fabrics can be of any type such as woven and nonwoven.

Examples of the material of the organic fibers include the following: polyethylene, poly(p-phenylenebenzobisoxazole), aramid, polyester, vinylon, polypropylene, nylon, rayon, polylactic acid, polyarylate, polyphenylene sulfide, polyimide, and fluorine resin.

Examples of the glass fiber include yarn-based glass cloth, chopped strand, and chopped strand sheet formed by machining the chopped strand.

Examples of the metal fibers include fiber fabrics and random mesh of steel or silver.

Other examples of the filler can be selected from spherical, crushed, flaky, and discontinuous fiber-like particles. The components of the filler are not particularly limited and may, for example, contain at least one substance including an element selected from Si, Cu, Ag, Au, Al, Mg, Pt, and Ti. Using such filler reduces the cost and improves the linear expansion, electrical conductivity, flame retardance, and optical properties such as refractive index. The size and particle diameter of the filler are not particularly limited; however, when the particle diameter is in the range from 1 nm to 100 nm, the filler can be used in comparatively small amounts to effectively improve the optical properties, electrical conductivity, and linear expansion. Meanwhile, fillers with a particle diameter in the range from 100 nm to 50 micrometers are easy to deal with and cost advantageous for manufacture.

Specific examples of the substance including an element selected from Si, Cu, Ag, Au, Al, Mg, Pt, and Ti include the following particles, flakes, and wires: silica, copper particles, copper-plated particles, silver particles, silver flakes, silver wires, silver-plated particles, gold particles, gold wires, gold-plated particles, aluminum particles, aluminum oxide particles, aluminum hydroxide particles, magnesium particles, magnesium hydroxide, magnesium oxide, platinum particles, platinum-plated particles, titanium particles, titanium oxide particles, and titanium oxide-coated particles. They may be used alone or in combination of two or more thereof. These particles, flakes, and wires may be used according to any of conventional and improved methods. More specifically, filler can be added to a varnish made by dissolving resin in a solvent and dispersed using a dispersing machine such as a bead mill, a jet mill, a planetary stirrer, a homodisper, or an ultrasonic wave disperser.

Still other examples of the filler include carbon nanotubes and/or metal wires. Using such filler is preferable to efficiently provide the resin composition with electrical conductivity. More specifically, the same level of electrical conductivity can be provided by adding smaller amounts of filler than spherical and flaky conductive materials. Thus, such filler is preferable because of its high cost-effectiveness as well as its easiness to maintain resin properties, allowing the resin composition to maintain its electrical conductivity when stretched, bent, or deformed in other ways.

These conductive materials can be dispersed in resin by any of conventional and improved methods. More specifically, a dispersion liquid is prepared by adding filler and a dispersant such as a cellulosic or amine- or sulfuric acid-based ionic liquid to a solvent such as water, methyl isobutyl ketone, methyl ethyl ketone, toluene, acetone, or dimethylformamide. Next, resin is added to the dispersion liquid, and the solvent is removed to disperse the filler into the resin.

The carbon nanotube is not particularly limited in type, but can be, for example, a single-wall carbon nanotube, a double-wall carbon nanotube, or a multiwall carbon nanotube. These carbon nanotubes can by synthesized by any of conventional and improved methods. Different types of carbon nanotubes are used for different purposes; for example, in order to give priority to electrical conductivity, it is preferable to use a carbon nanotube with high crystallinity, that is, a G/D ratio of 10 or more when determined by Raman spectroscopy.

Examples of the metal wire include discontinuous metal fibers with high aspect ratio, such as silver nanowires, silver nanorods, and gold nanorods.

The sizes of these carbon nanotubes and metal wires are not particularly limited; however, when the diameter is not less than 1 nm and not more than 100 nm and the length is not less than 1 micrometer and not more than 10 mm, the filler can be well dispersed in the resin so as to improve electrical conductivity and reinforcement.

The above-enumerated fillers may be used alone or in combination of two or more thereof.

In the case that the resin composition contains filler, the filler content can be properly adjusted according to the use of the stretchable resin sheet; it is preferably not less than 0.05 wt % and not more than 80 wt % in general. In this range, the resin properties can be maintained, and appropriate functions can be provided. A filler content of less than 0.05 wt % may not allow taking advantage of filler properties such as low-thermal expansion, thermal conductivity, and electrical conductivity. A filler content of more than 80 wt % may not allow taking advantage of resin properties such as stretchability, pliability, and extensibility. The filler content of not less than 0.05 wt % and not more than 50 wt % is more preferable because it provides high stress relaxation properties and few residual strains.

It is also preferable that the resin composition for stretchable resin sheet of the present exemplary embodiment contain a surface conditioner.

The surface conditioner is added to reduce the surface tension so as to improve the flatness of the surface of the cured stretchable resin sheet. The improved flatness improves adhesiveness and cohesiveness during the assembly of the structure including the stretchable resin sheet. The flatness is an important factor also to improve the precision of the gap space in hollow 7 in the first exemplary embodiment.

The content of the surface conditioner is not particularly limited; however, it is preferably 0.001 wt % to 20 wt %, and more preferably 0.1 wt % to 5 wt %. Too low a content tends to reduce the flatness, whereas too high a content may cause the stretchable resin sheet to be turbid, less heat resistant and less adhesive.

The surface conditioner can be of any type that is added for surface conditioning, such as acrylic-, vinyl-, silicone-, and fluorine-based compounds.

Examples of the acrylic-based surface conditioner include products mainly composed of polyalkyl acrylate, polyalkyl methacrylate, or (meth)acrylic copolymer.

Examples of the vinyl-based surface conditioner include products mainly composed of polyalkylvinylether or polybutadiene.

Example of the silicone-based surface conditioner include products mainly composed of polyether-modified polydimethylsiloxane, polyester-modified polydimethylsiloxane, polyether-modified polymethylalkylsiloxane, aralkyl-modified polymethylalkylsiloxane, polyether-modified polydimethylsiloxane, polyether-modified siloxane, polyphenylsiloxane, or polyester-modified hydroxyl group-containing polydimethylsiloxane.

Examples of the fluorine-based surface conditioner include products mainly composed of a silicone fluoride or a fluorine-based polymer.

They may be used alone or in combination of two or more thereof.

The stretchable resin sheet of the present exemplary embodiment can be used for various electronic components for various applications. Because of its flexibility, stress relaxation properties, and excellent restoration properties, the stretchable resin sheet has both stretchability and bendability, and is therefore suitable as a material for foldable electronic papers, organic EL displays, solar cells, RFIDs, pressure sensors, etc. Thus, the resin composition of the present exemplary embodiment can be appropriately used as the resin composition for stretchable resin sheet described in the first exemplary embodiment.

Meanwhile, wires can also be fabricated on a support body formed of the stretchable resin sheet of the present exemplary embodiment. The wires can be fabricated by any known method such as inkjet printing, screen printing, stencil printing, intaglio printing, relief printing, and planographic printing.

It is also preferable to use the above-described stretchable resin sheet of the present exemplary embodiment as a film on a support body. Using this stretchable resin sheet can achieve a flexible display device which can fit any curved surface and accommodate large deformation. The film may be formed using any general-purpose coater such as a spin coater, a bar coater, or a comma coater.

The support body can be made of any material; for example, rigid material such as glass, metal, and printed wiring board, or flexible, stretchable material such as resin film, flexible substrate, and elastomer.

When having a thickness of not less than 1 micrometer and not more than 1000 micrometers, and an elastic modulus of not less than 1 kPa and not more than 1 GPa at 30 degrees Celsius, the stretchable resin sheet of the present exemplary embodiment can have excellent transferability when applied, and hence can easily formed into a resin layer. As a result, the stretchable resin sheet can effectively exhibit the stress relaxation properties in the above-mentioned applications.

When having the elastic modulus at 30 degrees Celsius of not less than 10 kPa and not more than 500 MPa, the stretchable resin sheet can exhibit excellent adhesion, thereby having excellent transferability when applied, and hence being easily formed into a resin layer with applying pressure or heat. As a result, in the case of forming the stretchable structure, the stretchable resin sheet can be appropriately transferred into between layers or on a layer. In the case that the stretchable resin sheet is in the above-mentioned semi-cured state, the resin sheet can be firmly bonded to an object by applying light or heat or by thermal molding, thereby forming a stretchable structure having excellent heat resistance, chemical resistance, and stress relaxation properties.

The stretchable resin sheet formed on the support body can be used either together with the support body or alone by being removed from the support body. Examples of the stretchable resin sheet used together with the support body include a flexible substrate and a shield plate where the stretchable resin sheet is provided with wires thereon. Examples of the stretchable resin sheet used by being removed from the support body include a heat radiation film and a film provided with wires thereon fabricated by offset printing.

It is preferable that the stretchable resin sheet of the present exemplary embodiment be a wiring film with a circuit pattern formed thereon. This reduces the stress acting against the external force which causes disconnection, exfoliation, or destruction, thereby providing long-term reliability.

Furthermore, a structure for electronics can be formed by adhesively bonding or applying a target object, then applying pressure and heat to the resin composition, the film-like resin composition, or the stretchable resin sheet of the present exemplary embodiment. In the structure for electronics, the target object is provided between the stretchable resin sheets or on a part or entirety of the surface of the stretchable resin sheet. The structure for electronics may be used as a single body, or a plurality of the structures may be stacked. In short, this stretchable structure for electronics includes a cured body of the resin composition for stretchable resin sheet and a target object, which is formed on a part or entirety of the surface of the cured body. In the case where a plurality of the structures for electronics is stacked, at least one of target objects included in the structures is disposed between the cured bodies of the resin composition of the structure. Such a structure is preferable because it can reduce warpage and exfoliation due to stress and can contribute to yield improvement and cost reduction of the electronic devices. Using such a film or structure can achieve a flexible display device that can fit any curved surface and accommodate large deformation.

As described above, using the resin composition for stretchable resin sheet of the present exemplary embodiment, a stretchable resin sheet that has elastic deformability and few residual strains, and also has stress relaxation properties can be formed.

Using such a stretchable resin sheet can reduce the stress caused by these deformations, thereby reducing breakage and exfoliation between components, which occur in the conventional display devices. Moreover, the stretchable resin sheet of the present exemplary embodiment can be restored to its original shape when released from deformation.

Using such an excellent resin composition for stretchable resin sheet can achieve a flexible display device or other devices that can fit any curved surface and accommodate large deformation. Furthermore, having both high stress relaxation properties and restoration properties allows the resin composition to be applied to various technical fields such as optical, electronic, adhesive, and medical fields other than as flexible display devices.

It is also preferable that the resin composition for stretchable resin sheet contain epoxy resin and a curing agent. This allows the stretchable resin sheet to be excellent both in stress relaxation properties and restoration properties, and further to be excellent in heat resistance and toughness.

The present disclosure will now be described in detail by means of examples, but, the scope of the present disclosure is not limited to them.

The examples employ the following materials.

As the polyrotaxane of Component A, SH3400P available from Advanced Softmaterials Inc is used. SH3400P contains polyethylene glycol as the axle molecule, α-cyclodextrin as circular molecules, and an hydroxyl group as a reaction group.

As the thermosetting resin of Component B, the following epoxy resins are used: jER1003 available from Mitsubishi Chemical Corporation; EXA-4816 available from DIC corporation; and YP-50 available from Nippon Steel & Sumikin Chemical Co., Ltd. jER1003 is bifunctional and has 7 to 8 methyl groups per molecule and a molecular weight of 1300. EXA-4816 is bifunctional and has a large number of methyl groups per molecule and a molecular weight of 824. YP50 is bifunctional and as a large number of methyl groups per molecule and a molecular weight of 60,000 to 80,000.

As the curing agent of Component C, a cationic curing agent, SI-150 available from Sanshin Chemical Industry Co., Ltd., is used. SI-150 is sulfonium antimony hexafluoride. As the imidazole-based curing accelerator, 2E4MZ available from Shikoku Chemicals Corporation is used. 2E4MZ is 2-ethyl-4-methylimidazole.

What is used as the cross-linking agent of Component D is DN-950 available from DIC corporation, which is an isocyanate.

As the thermosetting resin of Component E, EP-4003 S available from ADEKA Corporation, and EG-280 available from Osaka Gas Chemicals Co., Ltd. are used. EP-4003S is a propylene oxide adduct of bisphenol A epoxy resin, and EG-280 is an ethylene oxide adduct of hydroxyphenyl fluorene epoxy resin.

As the curing agent of Component F, the following substances are used:
- a polyfunctional phenolic curing agent (GPH-103 available from Nippon Kayaku Co., Ltd., which is biphenyl aralkyl phenol);
- an epoxy resin curing agent (YH-306 available from Mitsubishi Chemical Corporation, which is an acid anhydride-based curing agent); and
- an imidazole-based curing accelerator (2E4MZ available from Shikoku Chemicals Corporation, which is 2-ethyl-4-methylimidazole).

As other resins, the following substances are used:
- silicone resin (SK-CLEAR sheet available from SK Co., Ltd.);
- polyethylene resin (UF421 available from Japan Polyethylene Corporation); and
- urethane resin (HUX-561 available from ADEKA Corporation).

(Resin Compositions 1 to 8)

Resin compositions 1 to 5 and 8 are prepared by adding the components (parts by weight) shown Tables 2 and 3 to a solvent (methyl ethyl ketone) in such a manner that the solid content concentration is 40% by weight and by uniformly mixing them (at 300 rpm for 30 minutes). Resign compositions 6 and 7 are prepared by uniformly mixing the components (parts by weight) shown in Table 3 (at 300 rpm for 30 minutes) in such a manner that the solid content concentration is 100%.

The obtained resin compositions 1 to 5 and 8 are coated on a 75 micrometer-thick PET film (support body) using a bar coater, dried at 100 degrees Celsius for 10 minutes to remove the solvent, and cured with heat at 170 degrees Celsius for 60 minutes, thereby preparing evaluation samples of these resin compositions. Meanwhile, the obtained resin compositions 6 and 7 are coated on a 75 micrometer-thick PET film (support body) using a bar coater, and cured with heat at 170 degrees Celsius for 120 minutes in a hermetically sealed condition, thereby preparing evaluation samples of these resin compositions.

(Resin Compositions 9 and 10)

Resin compositions 9 and 10 are already in the form of films, thus directly used as evaluation samples.

(Resin Composition 11)

Commercially available urethane resin is coated on a 75 micrometer-thick PET film (support body) using a bar coater and heat-dried at 120 degrees Celsius for 30 minutes, thereby preparing evaluation samples.

The films made of the obtained resin compositions 1 to 11 are used to form stretchable resin sheets each having a thickness of 50 micrometers and a shape of dumbbell No. 6 (the width of the portion to be measured is 4 mm, and the length of the parallel portion is 25 mm). The resulting stretchable resin sheets are evaluated as follows. Resin compositions 1, 2, 3, 6, and 7 correspond to Examples 7-1 to 7-5, respectively, as shown in Tables 2 and 3, whereas resin compositions 4, 5, 8, 9, 10, and 11 correspond to Comparative Examples 7-1 to 7-6, respectively.

(Extension-Restoration Test)

In the extension-restoration test conducted in the present exemplary embodiment, the samples of the Examples and Comparative Examples are subjected to an extension process and a restoration process under the conditions shown below, and the stress relaxation rate R and the residual strain rate alpha are calculated by the calculation methods shown below.

(Extension Process Conditions)

Deflection correction is carried out at a force of not more than 0.05N in order to eliminate the deflection generated when each test piece is attached to a clamp.
- speed of testing: 25 mm/min from 0% to 25% extension
- temperature: 23 degrees Celsius
- extension/holding condition: holding for 5 minutes at 25% extension (Restoration Process Conditions)

Speed of testing: 0.1 mm/min until the tensile force reaches 0±0.05 N
- temperature: 23 degrees Celsius The method of calculating the stress relaxation rate: the tensile force is measured at the time when the extension process is completed, and this value is defined as initial tensile force $F_{A0}$. Next, after the amount of strain is held under the above extension/holding conditions for 5 minutes, the tensile force is measured and defined as $F_A(t5)$. The stress relaxation rate R is calculated by the formula shown below.

$$R = \frac{F_{A0} - F_A(t5)}{F_{A0}} \times 100$$

The method of calculating the residual strain rate: the amount of strain is measured at the time when the tensile force reaches 0±0.05 N in the restoration process, and this value is defined as the residual strain rate alpha.

The stress relaxation rate R and the residual strain rate alpha obtained by the above-described method are shown in Tables 2 and 3.

Further, changes in the slope of the tensile force with respect to the amount of strain both during extension and during restoration (the slope during restoration/the slope during extension) within the extension range of 15 to 20% during the extension-restoration test mentioned above. The measurement results are also shown in Tables 2 and 3.

(Stress Relaxation Properties Test)

The samples of the Examples and the Comparative Examples mentioned above are subjected to an extension process under the conditions shown below, using a tensile-compression tester according to ISO 3384. When the extension process is completed, the tensile force is measured and defined as initial tensile force $F_{B0}$. After 30 minutes, tensile force $F_B(t30)$ is measured.

(Extension Process Conditions)

Deflection correction is carried out at a force of not more than 0.05N in order to eliminate the deflection generated when each test piece is attached to a clamp.
- speed of testing: 25 mm/min until reaching 50% extension
- temperature: 23 degrees Celsius
- extension/holding condition: holding for 30 minutes at 50% extension Next, $F_B(t30)/F_{B0}$ is calculated. The calculation results are shown in Tables 2 and 3.

Note that the evaluation samples of resin composition 8 was broken along the way, thus isunable to be subjected to either of the extension-restoration test or the stress relaxation properties test.

TABLE 2

|  |  | Example 7-1 resin composition 1 | Example 7-2 resin composition 2 | Example 7-3 resin composition 3 | Comp. Example 7-1 resin composition 4 | Comp. Example 7-2 resin composition 5 |
|---|---|---|---|---|---|---|
| polyrotaxane | A1000 | 100 | 100 | 100 | 100 | 100 |
| thermosetting resin | jER1003 | 75 |  |  |  | 150 |
|  | EXA-4816 |  | 100 |  |  |  |
|  | YP-50 |  |  | 100 |  |  |
| curing agent | 2E4MZ | 1.1 |  | 1.5 |  | 2.25 |
|  | SI-150 |  | 2 |  |  |  |
| additive | DN-950 | 45 | 45 | 45 | 45 | 45 |
| stress relaxation rate R |  | 25.3% | 43.0% | 39.5% | 2.0% | 82.0% |
| residual strain rate alpha |  | 0.6% | 2.7% | 1.1% | 0.5% | 7.3% |
| slope during restoration/ slope during extension |  | 0.91 | 0.92 | 0.83 | 1.04 | 0.98 |
| $F_B(t30)/F_{B0}$ |  | 0.62 | 0.6 | 0.67 | 0.97 | 0.24 |

TABLE 3

|  |  | Example 7-4 resin composition 6 | Example 7-5 resin composition 7 | Comp. Example 7-3 resin composition 8 | Comp. Example 7-4 resin composition 9 | Comp. Example 7-5 resin composition 10 | Comp. Example 7-6 resin composition 11 |
|---|---|---|---|---|---|---|---|
| thermosetting resin | propylene oxide adduct of bisphenol A epoxy resin | 100 | — | — | — | — | — |
|  | ethylene oxide adduct of hydroxyphenyl fluorene epoxy resin | — | 100 | — | — | — | — |
|  | jER1003 | — | — | 100 | — | — | — |
| curing agent | GPH-103 | 49 | — | 42 | — | — | — |
|  | YH-306 | — | 51 | — | — | — | — |
|  | 2E4MZ | 0.15 | 0.15 | 0.14 | — | — | — |
| silicone resin | SK-CLEAR sheet | — | — | — | 100 | — | — |
| polyethylene resin | UF421 | — | — | — | — | 100 | — |
| urethane resin | HUX-561 | — | — | — | — | — | 100 |
| stress relaxation rate R |  | 53.2% | 41.1% | N/A | 1% | 31% | 35% |
| residual strain rate alpha |  | 2.7% | 2.1% | N/A | 0.1% | 8.4% | 4.5% |
| slope during restoration/slope during extension |  | 0.83 | 0.81 | N/A | 0.99 | 58.70 | 0.87 |
| $F_B(t30)/F_{B0}$ |  | 0.41 | 0.5 | N/A | 0.92 | 0.75 | 0.52 |

(Production of the Structure)
(Mounting a Mirror Wafer with the Attach Film (DAF) on a Resin Sheet)

An 8" diameter mirror wafer with DAF (8 mm×8 mm×100 micrometers, DAF layer: FH900 available from Hitachi Chemical Co., Ltd., which has a thickness of 25 micrometers) is applied to each of the resin sheets formed of resin compositions 1 to 9. These resin sheets are placed on a hot plate heated at 160 degrees Celsius and pressed at 1 MPa for 60 minutes, thereby forming specimens of resin sheets with a wafer. The resin sheet of each specimen is extended by 30% at room temperature while both ends are being held. Next, the extension stress is released to confirm the state of the wafer and the adhesion after restoration. The results are shown in Table 4. The evaluation criteria are as follows.

After being extended, each structure is evaluated as follows: if restored without being partially or completely broken, the structure is determined to be OK; if not restored although not partially or completely broken, the structure is determined to be NG; and if partially or completely broken, the structure is determined to be Broken NG.

Note that Comparative Examples 7-5 and 7-6 are unable to be tested because of resin flow due to a high degree of melting of the resin during heating or during mounting and also because of the large deformation of the film.

TABLE 4

|  |  | wafer adhesion | 30% extension/ restoration |
|---|---|---|---|
| Example 7-1 | resin composition 1 | OK | OK |
| Example 7-2 | resin composition 2 | OK | OK |
| Example 7-3 | resin composition 3 | OK | OK |
| Comp. Example 7-1 | resin composition 4 | OK | NG |
| Comp. Example 7-2 | resin composition 5 | OK | NG |
| Example 7-4 | resin composition 6 | OK | OK |
| Example 7-5 | resin composition 7 | OK | OK |

TABLE 4-continued

| | | wafer adhesion | 30% extension/ restoration |
|---|---|---|---|
| Comp. Example 7-3 | resin composition 8 | OK | Broken NG |
| Comp. Example 7-4 | resin composition 9 | NG | Broken NG |
| Comp. Example 7-5 | resin composition 10 | resin flow | — |
| Comp. Example 7-6 | resin composition 11 | resin flow | — |

(Mounting a Mirror Wafer without DAF on a Filler-Containing Resin Sheet)

First, 30 parts by weight of resin solid content of silica (SO-25R available from Admatechs co., Ltd., which has a particle diameter of 0.5 micrometers) is added as filler to each of resin compositions 1 and 6. The resulting mixture is stirred for 30 minutes at 3000 rpm using a homodisper, thereby preparing silica-containing resin compositions. These resin compositions are coated on release-treated PET films using a bar coater and heated at 120 degrees Celsius for 5 minutes to remove the solvent, thereby forming semi-cured films. The semi-cured films are placed on a hot plate heated at 160 degrees Celsius and heat-treated for 60 minutes, thereby forming stretchable resin sheets of Examples 7-6 and 7-7.

In the same manner, 30 parts by weight of silica is added to resin composition 11, and subsequently the same procedure as in Examples 7-6 and 7-7 is performed, thereby forming the resin sheet of Comparative Example 7-7.

In the same manner as in Example 7-1, the extension-restoration test and the stress relaxation properties test are conducted. Table 5 shows the following values: the stress relaxation rate R, the residual strain rate alpha, the values of the slope during restoration/the slope during extension, and $F_B(t30)/F_{B0}$.

TABLE 5

| | | stress relaxation rate R | residual strain rate alpha | slope during restoration/ slope during extension | $F_B(t30)/F_{B0}$ |
|---|---|---|---|---|---|
| Example 7-6 | resin composition 1 + silica | 39.30% | 0.70% | 0.9% | 0.52% |
| Example 7-7 | resin composition 6 + silica | 64.10% | 2.70% | 0.82% | 0.32% |
| Comp. Example 7-7 | resin composition 11 + silica | 45.50% | 4.80% | 0.85% | 0.39% |

The above-described silica-containing resin composition is coated using a bar coater in the same manner as above and dried at 120 degrees Celsius for 30 minutes, thereby forming a silica-containing resin sheet. A wafer without DAF is placed on each of these resin sheets and pressed at 160 degrees Celsius and 1 MPa for 60 minutes, thereby forming resin sheet specimens having a wafer. The resin sheet of each specimen is extended by 30% at room temperature while both ends are being held in the same manner as in Example 7-1. Next, the extension stress is released to confirm the state of the wafer and the adhesion after restoration. The results are shown in Table 6. Note that in Comparative Example 7-7, the wafer is buried because of resin flow due to a high degree of melting of the resin.

TABLE 6

| | | wafer adhesion | 30% extension/ restoration |
|---|---|---|---|
| Example 7-6 | resin composition 1 + silica | OK | OK |
| Example 7-7 | resin composition 6 + silica | OK | OK |
| Comp. Example 7-7 | resin composition 11 + silica | resin flow | — |

The aforementioned results indicate that the stretchable resin sheet of the present exemplary embodiment can be restored to its original state without damage after being extended.

The cured material of the resin composition for stretchable resin sheet of the present exemplary embodiment can exhibit excellent restoration properties after extension and stress relaxation properties even if it contains inorganic filler.

These facts indicate that the stretchable structure of the present exemplary embodiment is useful as various electronics elements.

The sheet-shaped stretchable structure of the present disclosure has a hollow, which satisfy not only mountability and sealing properties but also extensibility, allowing the structure to be flexible and pliable. In addition, using this structure can achieve flexible display devices, flexible electronic circuits, etc. that can fit any curved surface and accommodate large deformation.

Furthermore, having not only high stretchability but also mountability and sealing properties allows the structure to be applied to various technical fields such as optical, electronic, adhesive, and medical fields other than as flexible display devices. Hence, the structure is industrially very applicable.

The resin composition for stretchable resin sheet of the present disclosure is also useful as various electronics elements.

What is claimed is:

1. A sheet-shaped stretchable structure used as an electronics element, the structure having a stretch of not less than 10% and comprising a plurality of laminated stretchable resin sheets,
   wherein at least one hollow is provided between at least one of pairs of two adjacent ones of the laminated stretchable resin sheets, and
   a support member formed of a resin material of one of the pairs of two adjacent ones of the laminated stretchable resin sheets, wherein
   the support member protrudes from the one of the pairs of two adjacent ones of the laminated stretchable resin sheets to abut the other of the pairs of two adjacent ones of the laminated stretchable resin sheets, thereby defining a volume of the hollow.

2. The sheet-shaped stretchable structure according to claim 1,
   wherein at least one of the laminated stretchable resin sheets is embossed with either a raised pattern or a recessed pattern.

3. The sheet-shaped stretchable structure according to claim 1, further comprising a conductive layer disposed at one of following positions:
   between any two adjacent ones of the laminated stretchable resin sheets;

on a top surface of an uppermost one of the laminated stretchable resin sheets; and
on a bottom surface of a lowermost one of the laminated stretchable resin sheets.

4. The sheet-shaped stretchable structure according to claim 3,
wherein the conductive layer forms a circuit pattern.

5. The sheet-shaped stretchable structure according to claim 1,
wherein at least one of the laminated stretchable resin sheets is transparent.

6. The sheet-shaped stretchable structure according to claim 1,
wherein each of the laminated stretchable resin sheets contains filler.

7. The sheet-shaped stretchable structure according to claim 1, further comprising one of a liquid, a pigment, a liquid crystal, and an electrophoretic solution required to operate a display disposed in the hollow.

8. The sheet-shaped stretchable structure according to claim 1,
wherein an insertion opening is provided such that the hollow is communicated with an outside of the sheet-shaped stretchable structure.

9. The sheet-shaped stretchable structure according to claim 1, further comprising an electronic component disposed in the hollow.

10. The sheet-shaped stretchable structure according to claim 1,
wherein each of the laminated stretchable resin sheets has a property of losing, with time, a stress caused by deformation due to an applied strain, and is restored to an original shape when the stress decreases to approximately zero.

11. A resin composition used in the stretchable resin sheets of the sheet-shaped stretchable structure according to claim 1, the resin composition having, after being cured, a stress relaxation rate R and a residual strain rate alpha, as measured by an extension-restoration test shown below, satisfying following relationships:

20%≤R≤95%, and

0%≤alpha≤3%

<Extension-restoration test>

A test piece of the resin composition having a thickness of 50 micrometers, a shape of dumbbell No. 6, a width of 4 mm in a portion to be measured, and a length of 25 mm in a parallel portion, being subjected to an extension process and then a restoration process under conditions shown below, using a tensile-compression tester according to ISO 3384, and the stress relaxation rate R and the residual strain rate alpha being calculated by a calculation method shown below, Extension process conditions:
Deflection correction being carried out at a force of not more than 0.05N in order to eliminate the deflection generated when the test piece is attached to a clamp,
Speed of testing: 25 mm/min from a non-stretched state to 25% extension
Temperature: 23 degrees Celsius
Extension/holding condition: holding for 5 minutes at 25% extension
Restoration process conditions:
Speed of testing: 0.1 mm/min until a tensile force reaches 0±0.05 N
Temperature: 23 degrees Celsius
Stress relaxation rate R calculation method: the tensile force being measured at a time when the extension process is completed, and defined as an initial tensile force $F_{A0}$, then an amount of strain being held for 5 minutes under the extension/holding conditions, thereafter the tensile force being measured and defined as $F_A(t5)$, with the stress relaxation rate R being calculated by a formula shown below $$R = \frac{F_{A0} - F_A(t5)}{F_{A0}} \times 100$$

Residual strain rate alpha calculation method: an amount of strain being measured at a time when the tensile force reaches 0±0.05 N in the restoration process, and the amount of strain being defined as the residual strain rate alpha.

12. A resin composition for stretchable resin sheet used in an electronics element, the resin composition having, after being cured, a stress relaxation rate R and a residual strain rate alpha, as measured by an extension-restoration test shown below, satisfying following relationships:

20%≤R≤95%, and

0%≤alpha≤3%

<Extension-restoration test>

A test piece of the resin composition having a thickness of 50 micrometers, a shape of dumbbell No. 6, a width of 4 mm in a portion to be measured, and a length of 25 mm in a parallel portion, being subjected to an extension process and then a restoration process under conditions shown below, using a tensile-compression tester according to ISO 3384, and the stress relaxation rate R and the residual strain rate alpha being calculated by a calculation method shown below, Extension process conditions:
Deflection correction being carried out at a force of not more than 0.05N in order to eliminate the deflection generated when the test piece is attached to a clamp,
Speed of testing: 25 mm/min from a non-stretched state to 25% extension
Temperature: 23 degrees Celsius
Extension/holding conditions: holding for 5 minutes at 25% extension
Restoration process conditions:
Speed of testing: 0.1 mm/min until a tensile force reaches 0±0.05 N
Temperature: 23 degrees Celsius
Stress relaxation rate R calculation method: the tensile force being measured at a time when the extension process is completed, and defined as an initial tensile force $F_{A0}$, then an amount of strain being held for 5 minutes under the extension/holding conditions, thereafter the tensile force being measured and defined as $F_A(t5)$, with the stress relaxation rate R being calculated by a formula shown below $$R = \frac{F_{A0} - F_A(t5)}{F_{A0}} \times 100$$

Residual strain rate alpha calculation method: an amount of strain being measured at a time when the tensile force reaches 0±0.05 N in the restoration process, and the amount of strain being defined as the residual strain rate alpha.

13. The resin composition according to claim 12, comprising an uncross-linked curing resin component, and having a property of being remelted or softened when heated and a thermosetting property or a photocurable property.

14. The resin composition according to claim 12, comprising epoxy resin and a curing agent.

15. The resin composition according to claim 12, comprising a surface conditioner.

16. The resin composition according to claim 12, comprising filler.

17. The resin composition according to claim 16, wherein the filler is at least one of organic fiber, carbon fiber, glass fiber, and metal fiber.

18. The resin composition according to claim 16, wherein the filler is in a form of spheres, crumbles, flakes, or discontinuous fibers and contains at least one substance including an element selected from Si, Cu, Ag, Au, Al, Mg, Pt, and Ti.

19. The resin composition according to claim 16, wherein the filler is at least one of a carbon nanotube and a metal wire, each having a diameter of not less than 1 nm and not more than 100 nm and a length of not less than 1 micrometer and not more than 10 mm.

20. The resin composition according to claim 16, wherein a content of the filler is not less than 0.05 wt % and not more than 80 wt %.

21. The resin composition according to claim 16, wherein a content of the filler is not less than 0.05 wt % and not more than 50 wt %.

22. A stretchable resin sheet comprising the resin composition according to claim 12 and having a thickness of not less than 1 micrometer and not more than 1000 micrometers and an elastic modulus of not less than 1 kPa and not more than 1 GPa at 30 degrees Celsius.

23. The stretchable resin sheet according to claim 22 having an elastic modulus of not less than 10 kPa and not more than 500 MPa at 30 degrees Celsius.

24. A stretchable structure for electronics, comprising:
a cured member of the resin composition according to claim 12; and
a target object laminated on either part or all of a surface of the cured member.

25. A stretchable structure for electronics comprising a plurality of the cured members of the resin composition according to claim 24 is laminated on one another.

26. The stretchable structure for electronics according to claim 25,
wherein at least one of the target objects included in the plurality of the cured members of the resin composition laminated on one another is disposed between the cured members of the resin composition of the plurality of the cured members of the resin composition laminated on one another.

* * * * *